United States Patent
Jeong et al.

(10) Patent No.: US 9,553,610 B2
(45) Date of Patent: Jan. 24, 2017

(54) TRANSMITTER, RECEIVER, AND SIGNAL PROCESSING METHOD THEREOF

(71) Applicant: SAMSUNG ELECTRONICS CO., LTD., Suwon-si (KR)

(72) Inventors: Hong-sil Jeong, Suwon-si (KR); Se-ho Myung, Yongin-si (KR); Kyung-joong Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 75 days.

(21) Appl. No.: 14/483,344

(22) Filed: Sep. 11, 2014

(65) Prior Publication Data

US 2015/0074485 A1    Mar. 12, 2015

Related U.S. Application Data

(60) Provisional application No. 61/882,145, filed on Sep. 25, 2013, provisional application No. 61/876,371, filed on Sep. 11, 2013.

(30) Foreign Application Priority Data

May 30, 2014    (KR) .................. 10-2014-0066349

(51) Int. Cl.
```
H03M 13/00      (2006.01)
H03M 13/29      (2006.01)
H04L 1/00       (2006.01)
H03M 13/35      (2006.01)
H03M 13/11      (2006.01)
```
(Continued)

(52) U.S. Cl.
CPC ......... *H03M 13/2906* (2013.01); *H03M 13/35* (2013.01); *H03M 13/6356* (2013.01); *H03M 13/6362* (2013.01); *H03M 13/6516* (2013.01); *H03M 13/6552* (2013.01); *H04L 1/00* (2013.01); *H03M 13/09* (2013.01);
(Continued)

(58) Field of Classification Search
None
See application file for complete search history.

(56) References Cited

U.S. PATENT DOCUMENTS

2007/0226578 A1    9/2007  Eroz et al.
2009/0259913 A1*  10/2009  Myung ............... H04L 1/0065
                                                            714/752
(Continued)

OTHER PUBLICATIONS

Search Report dated Dec. 10, 2014 issued by the International Searching Authority in counterpart International Patent Application No. PCT/KR2014/008479 (PCT/ISA/210).
(Continued)

*Primary Examiner* — Daniel McMahon
(74) *Attorney, Agent, or Firm* — Sughrue Mion, PLLC

(57) ABSTRACT

A transmitter and receiver of a broadcasting signal and a method of processing the broadcasting signal are provided. The transmitter includes: a segmenter configured to segment an L1 signaling of a frame into a plurality of segmented L1 signalings such that each of the segmented L1 signalings has bits a number of which is equal to or smaller than a predetermined number; and an encoder configured to perform a Bose, Chaudhuri, Hocquenghem (BCH) and a low density parity check (LDPC) encoding, or the LDPC encoding without the BCH encoding, with respect to the segmented L1 signalings.

20 Claims, 20 Drawing Sheets

(51) Int. Cl.
*H03M 13/09* (2006.01)
*H03M 13/15* (2006.01)

(52) U.S. Cl.
CPC ..... *H03M 13/1102* (2013.01); *H03M 13/1165* (2013.01); *H03M 13/152* (2013.01)

(56) References Cited

U.S. PATENT DOCUMENTS

| | | |
|---|---|---|
| 2011/0305300 A1 | 12/2011 | Ko |
| 2012/0243600 A1 | 9/2012 | Jeong et al. |
| 2012/0300690 A1 | 11/2012 | Vare et al. |
| 2013/0055051 A1 | 2/2013 | Jeong et al. |
| 2013/0117624 A1* | 5/2013 | Nicolas ................ H03M 13/27 714/755 |
| 2014/0133592 A1* | 5/2014 | Ko ........................ H04L 1/0057 375/261 |
| 2014/0229800 A1* | 8/2014 | Eroz .................... H03M 13/13 714/776 |
| 2014/0229801 A1* | 8/2014 | Eroz .................... H04L 1/0057 714/776 |

OTHER PUBLICATIONS

Written Opinion dated Dec. 10, 2014 issued by the International Searching Authority in counterpart International Patent Application No. PCT/KR2014/008479 (PCT/ISA/237).

\* cited by examiner

TRANSMITTER, RECEIVER, AND SIGNAL PROCESSING METHOD THEREOF

CROSS-REFERENCE TO THE RELATED APPLICATIONS

This application claims priority from Korean Patent Application No. 10-2014-0066349, filed on May 30, 2014, in the Korean Intellectual Property Office, and U.S. Provisional Application Nos. 61/882,145 and 61/876,371, filed on Sep. 25, 2013 and Sep. 11, 2013, respectively, in the United States Patent and Trademark Office, the disclosures of which are incorporated herein in their entirety by reference.

BACKGROUND

1. Field

Apparatuses and methods consistent with exemplary embodiments of the inventive concept relate to a transmitter, a receiver, and a signal processing method thereof, which can process L1 signaling.

2. Description of the Related Art

In the 21st century information society, broadcasting communication services are characterized by digitalization, multi-channel, broadband, and high quality. Recently, as a high-quality digital television (TV), a portable media player (PMP), and a portable broadcasting device have been widely used, there is an increasing demand to support various methods for receiving digital broadcasting services.

In compliance with such a demand, the standards group has established various standards and specifications, such as the digital video broadcasting the second generation European terrestrial (DVB-T2), to satisfy user needs. However, there is still a need for better transmission and reception performances for broadcasting services.

SUMMARY

One or more exemplary embodiments provide a transmitter, a receiver, and a signal processing method thereof, which can improve transmission and reception performance of broadcasting signals.

According to an aspect of an exemplary embodiment, there is provided a transmitter which may include: a segmenter configured to segment an L1 signaling of a frame into a plurality of segmented L1 signalings such that each of the segmented L1 signalings has bits a number of which is equal to or smaller than a predetermined number; and an encoder configured to perform a Bose, Chaudhuri, Hocquenghem (BCH) and a low density parity check (LDPC) encoding, or the LDPC encoding without the BCH encoding, with respect to the segmented L1 signalings.

Here, the predetermined number may be smaller than at least one of a length of an information word of the BCH encoding and a length of an information word of the LDPC encoding.

Further, the predetermined number may be calculated based on t a predetermined transmission code rate, a number of parity bits generated by the BCH encoding, and a number of parity bits generated by the LDPC encoding.

In this case, the predetermined number may be calculated on the basis of the following equation, $$K_{th} = \left\lfloor \frac{R_t}{1-R_t} \cdot N_{parity} \right\rfloor - N_{bch\_parity}$$

where $K_{th}$ is the predetermined number, $R_t$ is the predetermined transmission code rate, $N_{parity}$ is the number of parity bits generated by the LDPC encoding, and $N_{bch\_parity}$ is the number of parity bits generated by the BCH encoding.

According to an aspect of another exemplary embodiment, there is provided a signal processing method of a transmitter which may include: segmenting an L1 signaling of a frame into a plurality of segmented L1 signalings such that each of the segmented L1 signalings has bits a number of which is equal to or smaller than a predetermined number; and performing BCH encoding and LDPC encoding, or the LDPC encoding without the BCH encoding, with respect to the segmented L1 signalings.

Here, the predetermined number may be smaller than at least one of a length of an information word of the BCH encoding and a length of an information word of the LDPC encoding.

Further, the predetermined number may be calculated based on a predetermined transmission code rate, a number of parity bits generated by the BCH encoding, and a number of parity bits generated by the LDPC encoding.

In this case, the predetermined number may be calculated on the basis of the above equation.

According to an aspect of still another exemplary embodiment, there is provided a receiver which may include: a decoder configured to perform LDPC decoding and BCH decoding, or the LDPC decoding without the BCH decoding, to output a plurality of segmented L1 signalings which are generated by segmenting an L1 signaling of a frame such that each of the segmented L1 signalings has bits a number of which is equal to or smaller than a predetermined number, based on a channel value of a signal that is received from a transmitter; and a desegmenter configured to perform desegmentation of the plurality of segmented L1 signalings output from the LDPC decoding and the BCH decoding or the LDPC decoding without the BCH decoding.

Here, the predetermined number may be smaller than one of a length of an information word of the BCH encoding and a length of an information word of the LDPC encoding.

Further, the predetermined number may be calculated based on t a predetermined transmission code rate, a number of parity bits generated by BCH encoding performed by the transmitter, and a number of parity bits generated by LDPC encoding performed by the transmitter.

In this case, the predetermined number may be calculated on the basis of the above equation.

According to an aspect of still another exemplary embodiment, there is provided a signal processing method of a receiver which may include: performing LDPC decoding and BCHdecoding, or the LDPC decoding without the BCH decoding, to output a plurality of segmented L1 signalings which are generated by segmenting an L1 signaling of a frame such that each of the segmented L1 signalings has bits a number of which is equal to or smaller than a predetermined number, on the basis of a channel value of a signal that is received from a transmitter; and performing desegmentation of the plurality of segmented L1 signalings output from the LDPC decoding and the BCH decoding or the LDPC decoding without the BCH decoding.

Here, the predetermined number may be smaller than one of a length of an information word of the BCH encoding and a length of an information word of the LDPC encoding.

Further, the predetermined number may be calculated based on t a predetermined transmission code rate, a number of parity bits generated by BCH encoding performed by the transmitter, and a number of parity bits generated by LDPC encoding performed by the transmitter.

In this case, the predetermined number may be calculated on the basis of the above equation.

As described above, according to various exemplary embodiments of the inventive concept, since the transmitter efficiently segments and encodes the L1 signaling, transmission and reception performances of the transmitter and the receiver may be improved.

BRIEF DESCRIPTION OF THE DRAWINGS

The above and other aspects, features and advantages of the exemplary embodiments will be more apparent from the following detailed description when taken in conjunction with the accompanying drawings, in which.

DETAILED DESCRIPTION OF THE EXEMPLARY EMBODIMENTS

Hereinafter, exemplary embodiments of the inventive concept are described in detail with reference to the accompanying drawings. In explaining the exemplary embodiments, if it seems that a detailed explanation regarding a related art or configuration obscures a substance of the inventive concept with an unnecessary detail, the detailed explanation will be omitted. Terms used herein may be consistent with those described in the standard referred to as the digital video broadcasting the second generation European terrestrial (DVB-T2).

Figure 1:
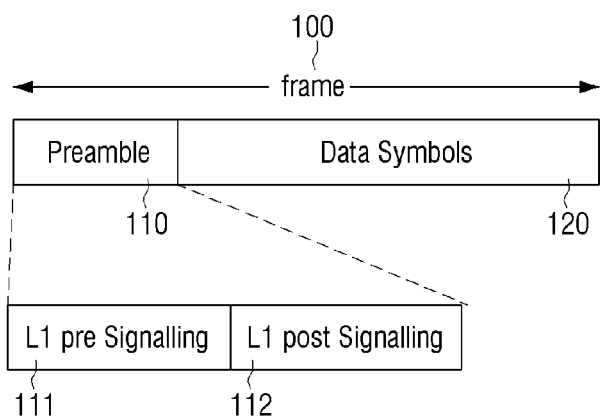
FIG. 1 is a diagram illustrating a frame structure used in a broadcasting/communication system, according to an exemplary embodiment.

FIG. 1 is a diagram illustrating a frame structure used in a broadcasting/communication system, according to an exemplary embodiment. Referring to FIG. 1, a frame 100 includes a preamble 110 and data symbols 120.

The preamble 110 is a portion for transmitting an L1 signaling, and as illustrated in FIG. 1, may include an L1 pre signaling (i.e., L1 pre signaling information) 111 and an L1 post signaling (i.e., L1 post signaling information) 112.

Here, the L1 pre signaling includes information that is required for a receiver (not illustrated) to receive and decode the L1 post signaling 112, and the L1 post signaling includes parameters that are required for the receiver (not illustrated) to access a physical layer pipe (PLP). In this case, the L1 post signaling 112 may include L1 configurable information, L1 dynamic information, cyclic redundancy check (CRC) information, and L1 padding.

The data symbols 120 may be a portion for actually transmitting broadcasting data, and may include one or more PLPs. In this case, the respective PLP may independently perform different signal processes. For example, different modulation methods and code rates may be used for the respectively PLPs.

As described above, in a broadcasting/communication system, a transmitting side (transmitter) may transmit broadcasting data with a frame structure as illustrated in FIG. 1, and a receiving side (receiver) may receive the broadcasting data through the PLPs by acquiring information about a data transmission method and a frame length from the L1 signaling.

Hereinafter, a method for processing the L1 post signaling of the L1 signaling according to an exemplary embodiment will be described. In the following description, lengths of a codeword, information word (or information word bits), parity bits, and L1 signaling mean the numbers of bits included therein.

Figure 2:
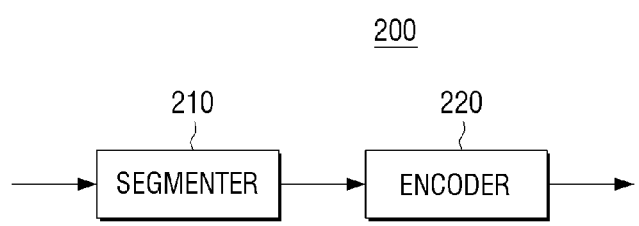
FIG. 2 is a block diagram illustrating a configuration of a digital broadcasting transmitter, according to an exemplary embodiment.

FIG. 2 is a block diagram illustrating a configuration of a digital broadcasting transmitter, according to an exemplary embodiment. Referring to FIG. 2, a transmitter 200 includes a segmenter 210 and an encoder 220.

The segmenter 210 performs segmentation of the L1 signaling. Here, the L1 signaling may be an L1 post signaling. As described above, since the L1 post signaling includes parameters for the receiving side to access the PLPs, the length of the L1 post signaling may be variable according to the PLPs.

Specifically, the segmenter may segment the L1 into a plurality of segmented L1 signalings such that each of the segmented L1 signalings has bits the number of which is equal to or smaller than a predetermined number. That is, if the number of bits that constitute the L1 signaling is larger than the predetermined number, the segmenter 210 can perform segmentation of the L1 signaling. Accordingly, the plurality of segmented L1 signalings can form bit strings. In this case, the number of bits of each segmented L1 signaling may be limited to the predetermined number or less, and the predetermined number may be smaller than the length of an information word of a Bose, Chaudhuri, Hocquenghem (BCH) codeword or the length of an information word of a low density parity check (LDPC) codeword.

The detailed method for segmenting the L1 signaling through the segmenter 210 is as follows.

The L1 signaling is segmented by the segmenter 210, and each segmented L1 signaling is encoded by the encoder 220. A plurality of LDPC codewords that are generated through the encoding, i.e., a plurality of LDPC coded blocks or LDPC blocks, may be transmitted to the receiving side. As described above, since the bits that constitute the L1 signaling are transmitted to the receiving side through the LDPC blocks, the segmenter 210 calculates the number of LDPC blocks $N_{post\_FEC\_Block}$ (or, may be called $N_{L1post\_FECFRAME}$) on the basis of Equation 1 below.

$$N_{post\_FEC\_Block} = \left\lceil \frac{K_{post\_ex\_pad}}{K_{th}} \right\rceil, \quad (1)$$

where $K_{post\_ex\_pad}$ (or, may be called $K_{L1post\_ex\_pad}$) is a length of the L1 signaling. Specifically, $K_{post\_ex\_pad}$ may be the length of the L1 signaling which does not include the length of the L1 padding to be described below. In addition, $K_{th}$ is a predetermined number proposed according to an exemplary embodiment, and means the maximum number of bits of the segmented L1 signaling. That is, $K_{th}$ may be the maximum threshold value for the number of bits that constitute the segmented L1 signaling. Further, since each segmented L1 signaling is encoded to form an LDPC block, $K_{th}$ may mean the maximum number of bits of the L1 signaling that is included in one LDPC block.

Further, the segmenter 210 calculates the number of bits $K_{L1\_PADDING}$ (or, may be called $K_{L1post\_PADDING}$) of padding bits (i.e., L1 padding) that should be added (or padded) to the L1 signaling for segmentation on the basis of Equation 2 below. Here, the padding bits may be formed of zero bits. Here, the zero bits refer to bits having bit value "0". However, the padding bits may be formed of a different bit value or bit value pattern.

$$N_{L1\_PADDING} = \left\lceil \frac{K_{post\_ex\_pad}}{N_{post\_FEC\_Block}} \right\rceil \times N_{post\_FEC\_Blok} - K_{post\_ex\_pad}, \quad (2)$$

where $K_{post\_ex\_pad}$ is the length of the L1 signaling, and $N_{post\_FEC\_Block}$ is the number of LDPC blocks.

As described above, addition of the L1 padding is to make each segmented L1 signaling be formed of the same number of bits.

Thereafter, the segmenter 210 may add the padding bits as calculated to the L1 signaling, and segment the L1 signaling to which the padding bits are added.

Specifically, the segmenter 210 may calculate the length $K_{post}$ (or, may be called $K_{L1post}$) of the L1 signaling to which the padding bits are added, on the basis of Equation 3 below, and may calculate the length $K_{sig}$ of each segmented L1 signaling by dividing the length $K_{post}$ of the L1 signaling, to which the padding bits are added, by the number $N_{post\_FEC\_Block}$ of LDPC blocks, based on Equation 4 below. Further, the segmenter 210 may generate a plurality of segmented L1 signalings having the length of $K_{sig}$ by performing segmentation of the L1 signaling according to the calculated length $K_{sig}$.

$$K_{post} = K_{post\_ex\_pad} + K_{L1\_PADDING} \quad (3)$$

where $K_{post\_ex\_pad}$ is the length of the L1 signaling, and $K_{L1\_PADDING}$ is the number of padding bits.

$$K_{sig} = \frac{K_{post}}{N_{post\_FEC\_Block}}, \quad (4)$$

where $K_{post}$ is the length of the L1 signaling to which the padding bits are added, and $N_{post\_FEC\_Block}$ is the number of LDPC blocks.

As described above, the segmenter 210 may segment the L1 signaling based on the above-described methods in Equation 1 to Equation 4, and may output a plurality of segmented L1 signalings to the encoder 220.

In this case, the length of each segmented L1 signaling may be equal to or smaller than the predetermined value $K_{th}$. That is, $K_{sig} \leq K_{th}$ can be satisfied. Specifically, as described above, since the length of the L1 signaling is variable and the number of LDPC blocks is calculated through the method expressed in Equation 1, the length of the segmented L1 signaling may become equal to or smaller than the predetermined value $K_{th}$. Accordingly, the maximum number of bits included in the segmented L1 signaling may become $K_{th}$.

The segmented L1 signaling may be formed of L1 signaling bits only, or may be formed of the L1 signaling bits and padding bits.

That is, if the length of the L1 signaling is an integer multiple of $K_{th}$, the L1 signaling is segmented in a state where the padding bits are not added thereto as expressed in Equation 1, and thus each of the segmented L1 signalings may be formed of the L1 signaling bits only. However, if the length of the L1 signaling is not an integer multiple of $K_{th}$, the L1 signaling is segmented after the padding bits are added thereto as expressed in Equations 2-4, and a part of the segmented L1 signalings may be formed of the L1 signaling bits only and the remaining part may be formed of the L1 signaling bits and the padding bits.

Figure 3:
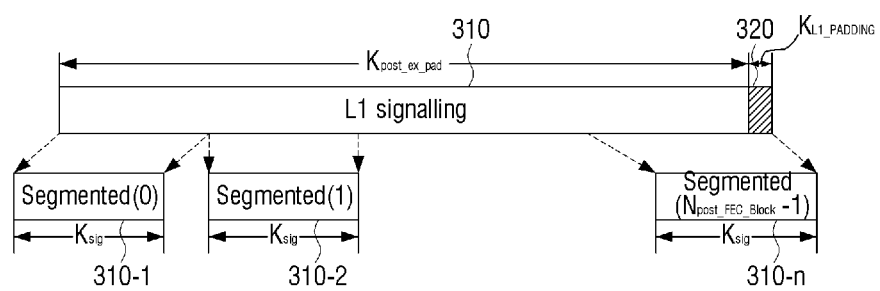
FIG. 3 is a diagram explaining a method for segmenting L1 signaling, according to an exemplary embodiment.

FIG. 3 is a diagram explaining a method for segmenting L1 signaling, according to an embodiment.

As illustrated in FIG. 3, the L1 signaling 310 having the length of $K_{post\_ex\_pad}$ may be segmented into $N_{post\_FEC\_Block}$ segmented L1 signalings after $K_{L1\_PADDING}$ bits 320 are added to the L1 signaling 310. Accordingly, the segmented L1 signalings 310-1 to 310-n may have the length of $K_{sig}$. In this case, $K_{sig} \leq K_{th}$ is satisfied.

Referring again to FIG. 2, the encoder 220 may encode the segmented L1 signalings. That is, the encoder 220 may perform encoding in a unit of the segmented L1 signaling. Here, since the segmented L1 signaling is formed of $K_{sig}$ bits, the encoder 220 may perform encoding in a unit of $K_{sig}$ bits.

In this case, the encoder 220 may perform BCH encoding and LDPC encoding with respect to the segmented L1 signalings.

Hereinafter, referring to FIGS. 4A and 4B, the encoder 220 will be described in more detail.

Figure 4A:
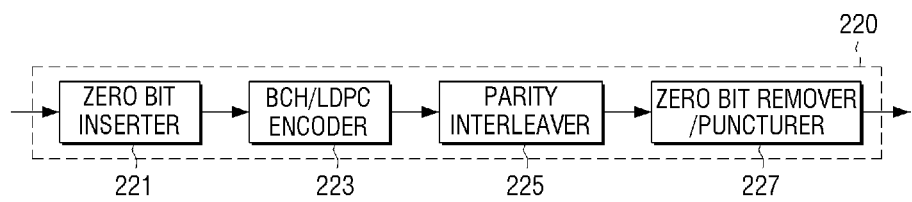
FIGS. 4A and 4B are block diagrams illustrating a configuration of an encoder, according to exemplary embodiments.
Figure 4B:
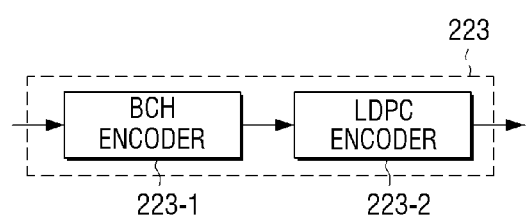

FIGS. 4A and 4B are block diagrams illustrating a configuration of an encoder, according to an exemplary embodiment. First, referring to FIG. 4A, the encoder 220 may include a zero bit inserter 221, a BCH/LDPC encoder 223, a parity interleaver 225, and a zero bit remover/puncturer 227.

The zero bit inserter 221 adds zero bits (or zero padding bits) to the segmented L1 signaling.

Specifically, as shown in FIG. 4A, the BCH/LDPC encoder 223 includes a BCH encoder 223-1 for performing BCH encoding and an LDPC encoder 223-2 for performing LDPC encoding. That is, the BCH encoder 223-1 may generate a BCH codeword through the BCH encoding to output the BCH codeword to the LDPC encoder 223-2, and the LDPC encoder 223-2 may perform LDPC encoding using the BCH codeword as an information word. In this case, in the case of the LDPC encoding that is performed by the LDPC encoder 223-2, an information word having a predetermined length is required according to the code rate, and thus the BCH encoder 223-1 should generate a BCH codeword having the predetermined length.

In order for the BCH encoder 223-1 to generate a BCH codeword having the predetermined length, it is required to perform the BCH encoding with respect to a predetermined number of bits. Accordingly, the zero bit inserter 221 may pad zero bits to the segmented L1 signaling so that the segmented L1 signaling has the length of the information word that is required in the BCH code, and may output L1 post signaling to which the zero bits are padded to the BCH/LDPC encoder 223.

As described above, the length of the segmented L1 signaling may be equal to or smaller than $K_{th}$. Here, $K_{th}$ may be smaller than the length of the information word that is required during the BCH encoding. Since the length of the information word that is required during the BCH encoding is smaller than the length of the information word that is required during the LDPC encoding, $K_{th}$ may be smaller than the length of the information word that is required during the LDPC encoding.

Accordingly, the zero bit inserter 221 may add the zero bits to the segmented L1 signaling. For example, in the case where the segmented L1 signaling is formed of $K_{sig}$ bits, the number of bits of the information word that is required during the BCH encoding is $K_{bch}$, and $K_{bch} > K_{sig}$ is set, the zero padding bit inserter 221 may add $K_{bch} - K_{sig}$ zero bits to the segmented L1 signaling.

However, according to circumstances, the BCH encoder 223-1 may be omitted from the BCH/LDPC encoder 223, and the BCH/LDPC encoder 223 may perform only the LDPC encoding without the BCH encoding.

In this case, the zero bit inserter 221 may pad the zero bits to the segmented L1 signaling so that the segmented L1 signaling has the length of the information word that is required in the LDPC codeword. For example, if the segmented L1 signaling is formed of $K_{sig}$ bits, the number of bits of the information word of the LDPC codeword is $K_{ldpc}$, and $K_{ldpc} > K_{sig}$ is set, the zero padding bit inserter 221 may add $K_{ldpc} - K_{sig}$ zero bits to the segmented L1 signaling.

As described above, the zero bit inserter 221 may insert the zero bits into the segmented L1 signaling, and then may output the L1 signaling into which the zero bits are inserted to the BCH/LDPC encoder 223.

The BCH/LDPC encoder 223 performs the BCH encoding and the LDPC encoding with respect to the L1 signaling transmitted from the zero bit inserter 221. For this, as shown in FIG. 4B, the BCH/LDPC encoder 223 may include a BCH encoder 223-1 for performing the BCH encoding and an LDPC encoder 223-2 for performing the LDPC encoding.

Specifically, the BCH encoder 223-1 generates BCH parity bits by performing the BCH encoding of the L1 signaling, to which the zero bits are added, as the information word, and generates a plurality of BCH codewords formed of the information word and the BCH parity bits. Here, 168 BCH parity bits may be generated by the BCH encoding.

Further, the LDPC encoder 223-2 may generate LDPC parity bits by performing the LDPC encoding with respect to the BCH codewords generated by the BCH encoding, and may output a plurality of LDPC codewords formed of the information word and the LDPC parity bits to the parity interleaver 225. For example, if the length of the information word of the BCH encoder 223-1 is $K_{bch}$, and the length of the information word of the LDPC encoder 223-2 is $K_{ldpc}$, the LDPC encoder 223-2 may generate the LDPC codeword having the length of $N_{ldpc}$ by performing the LDPC encoding at a constant code rate.

Since the BCH code and the LDPC code are systematic codes, the information word may be included in the codeword. That is, since the BCH encoding is performed using the L1 signaling as the information word, the BCH codeword generated as a result of the BCH encoding may include the L1 signaling that is the information word as it is, and may be in the form in which the BCH parity bits are added to the information word. Further, since the LDPC encoding is performed using the BCH codeword as the information word, the LDPC codeword generated as a result of the LDPC encoding may include the L1 signaling that is the information word and the BCH parity bits as they are, and may be in the form in which the LDPC parity bits are added to the information word.

In the above-described example, it is described that both the BCH encoding and the LDPC encoding are performed. However, this is merely exemplary, and according to circumstances, the BCH encoding may be omitted. That is, the BCH encoder 223-1 may be omitted. Accordingly, the LDPC encoder 223-2 may generate the LDPC codeword through performing of the LDPC encoding using the L1 signaling transmitted from the zero bit inserter 221 as the information word, and may output the generated LDPC codeword to the parity interleaver 225.

Further, in the above-described example, it is described that the zero bits are added to the segmented L1 signaling by the zero bit inserter 221 and the BCH encoding and the LDPC encoding are sequentially performed with respect to the L1 signaling to which the zero bits are added. However, this is merely exemplary, and the zero bit inserter 221 may be arranged between the BCH encoder 223-1 and the LDPC encoder 223-2. The detailed explanation will be made later with reference to FIG. 10.

The parity interleaver 225 performs parity interleaving with respect to the L1 signaling transmitted from the BCH/LDPC encoder 223.

Specifically, the parity interleaver 225 performs the interleaving only with respect to the LDPC parity bits among the LDPC codeword bits, and outputs the parity-interleaved LDPC codeword to the zero bit remover/puncturer 227.

However, according to circumstances as described above, the parity interleaver 225 may be omitted. In this case, the L1 signaling encoded without interleaving of the LDPC parity bits may be output to the zero bit remover/puncturer 227.

The zero bit remover/puncturer 227 may remove the zero bits from the L1 signaling transmitted from the parity interleaver 225 and perform puncturing of the L1 signaling.

First, in the case where the zero bits are added by the zero bit inserter 221, the zero bit remover/puncturer 227 may remove the added zero bits. That is, the zero bit remover/puncturer 227 may remove the zero bits padded by the zero bit inserter 221 among the bits output from the parity interleaver 225 based on the positions and the number of zero bits padded by the zero bit inserter 221. Through this, it is called shortening that the padded zero bits are encoded and then removed.

Further, the zero bit remover/puncturer 227 may perform puncturing of at least a part of the LDPC parity bits output from the parity interleaver 225. In this case, the number of punctured LDPC parity bits may vary according to the channel environment, and the punctured LDPC parity bits are not transmitted to the receiving side.

The bits output from the zero bit remover/puncturer 227 may be transmitted to a receiver (not illustrated). For example, the transmitter 200 may modulate the bits output from the zero bit remover/puncturer 227, perform mapping of the modulated bits on an orthogonal frequency division multiplexing (OFDM) frame, and transmit the mapped OFDM frame to the receiver. In this case, the L1 signaling may be mapped on a preamble in the OFDM frame.

Hereinafter, a method for determining $K_{th}$ will be described in detail.

As described above, the segmented L1 signaling into which the zero bits are inserted is encoded to generate the LDPC codeword, and the generated LDPC codeword is transmitted to the receiver in a state where the partial LDPC parity bits of the LDPC codeword have been punctured. Here, the puncturing means that the partial parity bits are not transmitted, and may be performed in the case where the partial parity bits are unable to be transmitted or it is not required to transmit the partial parity bits.

As an example, it is assumed that the L1 signaling bits are mapped on one OFDM symbol to be transmitted. In this case, the number of sub-carriers by which the L1 signaling bits of the one OFDM symbol can be transmitted in the BPSK modulation method is 5028, and if the number of L1 signaling bits is 683, 168 BCH parity bits and 4177 (=5028−683−168) LDPC parity bits can be transmitted.

In the case of generating the LDPC codeword that is formed of 16200 bits based on 2/5 code rate during the LDPC encoding, the number of LDPC parity bits that constitute a LDPC codeword is 9720, and it is required that 5543 (=9720−4177) LDPC parity bits are punctured to transmit 4177 LDPC parity bits.

As described above, the puncturing may be performed in the case where a part of the parity bits are unable to be transmitted.

As another example, the puncturing may be performed in the case where it is not necessary to transmit a part of the parity bits. Specifically, it is required to transmit the L1 signaling at a predetermined transmission code rate in order for the receiving side to receive the L1 signaling without error. Accordingly, it is not necessary for the transmitting side to transmit a part of parity bits which is not required according to the predetermined transmission code rate, and thus the part of the LDPC parity bits generated in the LDPC encoding process may be punctured.

As described above, a part of the parity bits generated in the encoding process may be punctured and not transmitted. However, if the number of punctured parity bits is increased, it may cause deterioration of the performance. This will be described in detail with reference to FIGS. 5A and 5B.

Figure 5A:
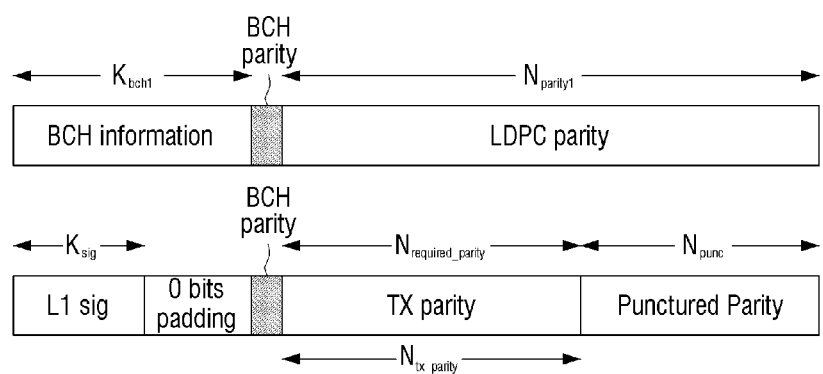
FIGS. 5A and 5B are diagrams explaining a relationship between a code rate and parity bits being punctured, according to exemplary embodiments.
Figure 5B:
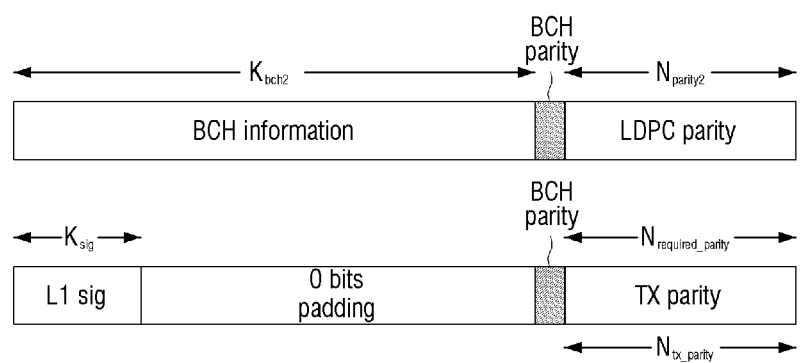

FIG. 5A illustrates a case where the L1 signaling is LDPC-encoded based on a low code rate, and FIG. 5B illustrates a case where the L1 signaling is LDPC-encoded based on a high code rate.

Here, $K_{sig}$ is the length of the segmented L1 signaling, $K_{bch1}$ and $K_{bch2}$ are the lengths of the information word of the BCH code, and $N_{parity1}$ and $N_{parity2}$ are the lengths of the LDPC parity bits generated according to the LDPC encoding. Further, $N_{required\_parity}$ is the length of the LDPC parity bits that satisfies a required transmission code rate, $N_{tx\_parity}$ is the length of the LDPC parity bits actually transmitted, and $N_{punc}$ is the length of the punctured LDPC parity bits.

Referring to FIGS. 5A and 5B, in the case of performing the LDPC encoding at a relatively low code rate as compared with the case of performing the LDPC encoding at a relatively high code rate, more LDPC parity bits are generated. Accordingly, in the case of encoding the L1 signaling having the same length, more LDPC parity bits should be punctured when the LDPC encoding is performed at the relatively low code rate to satisfy the required transmission code rate. That is, in the case of performing the LDPC encoding at the relatively low code rate in order to transmit the LDPC parity bits having the same length, a larger amount of LDPC parity bits should be punctured. Accordingly, in the case of performing the LDPC encoding at the relatively low code rate, relatively greater deterioration of the performance may be caused.

However, in the case of performing the LDPC encoding of the L1 signaling based on the high code rate, the number of LDPC parity bits may not satisfy the required transmission code rate. That is, such non-satisfaction may occur in the case where the number of LDPC parity bits generated by the LDPC encoding is smaller than the number of LDPC parity bits required for the receiving side to receive the L1 signaling without error. This will be described in detail with reference to FIGS. 6A and 6B. Various parameters illustrated in FIGS. 6A and 6B have the same meaning as those illustrated in FIGS. 5A and 5B.

Figure 6A:
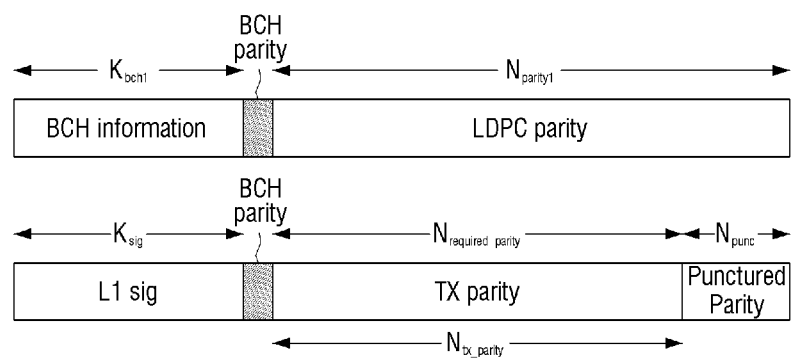
FIGS. 6A and 6B are diagrams explaining a relationship between a code rate and parity bits being transmitted, according to exemplary embodiments.
Figure 6B:
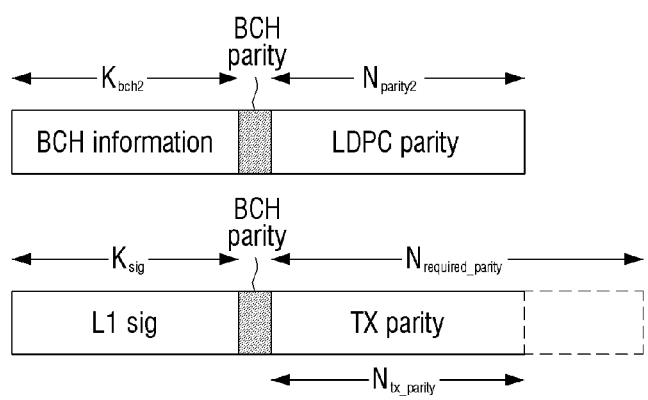

FIG. 6A illustrates a case where the L1 signaling having the same length as the length of the information word of the BCH codeword is LDPC-encoded on the basis of a low code rate, and FIG. 6B illustrates a case where the L1 signaling having the same length as the length of the information word of the BCH codeword is LDPC-encoded on the basis of a high code rate.

As illustrated in FIGS. 6A and 6B, in the case of performing the LDPC encoding at a relatively high code rate, the number of LDPC parity bits generated through the LDPC encoding becomes insufficient in comparison to the number of LDPC parity bits required for the receiving side to receive the L1 signaling without error, and thus the performance becomes lower in the case of performing the LDPC encoding on the basis of the relatively high code rate.

Accordingly, it is necessary to limit the number of bits input to a predetermined value in order to satisfy the transmission code rate that is required when the L1 signaling is LDPC-encoded on the basis of the high code rate, and the limited number of bits may be reflected in the predetermined number $K_{th}$ presented according to an exemplary embodiment. In this case, $K_{th}$ may be a value that is smaller than the length of the information word of the BCH code or the length of the information word of the LDCP codeword.

Hereinafter, for convenience of explanation, it is assumed that the segmented L1 signaling is formed of $K_{th}$ bits, i.e., $K_{sig}=K_{th}$. Accordingly, the number of input bits that are input to the encoder 220 may be $K_{th}$.

Here, the predetermined number may be determined based on the required transmission code rate, the number of parity bits generated through the BCH encoding, and the number of parity bits generated through the LDPC encoding, and specifically, may be calculated on the basis of Equation 5 below.

$$K_{th} = \left\lfloor \frac{R_t}{1-R_t} \cdot N_{parity} \right\rfloor - N_{bch\_parity}, \tag{5}$$

where $K_{th}$ is the predetermined number presented according to the present embodiment, and denotes the maximum number of bits of the segmented L1 signaling. Here, since $K_{th}$ may be smaller than the length of the information word of the BCH encoding, the number of input bits input to the encoder 220 may be smaller than the length of the information word that is required during the BCH encoding.

Further, $N_{parity}$ is the number of LDPC parity bits generated by the LDPC encoding, and $N_{bch\_parity}$ is the number of BCH parity bits generated by the BCH encoding.

Further, $R_t$ denotes a required transmission code rate in the case where the segmented L1 signaling is formed of $K_{th}$ bits. Here, the required transmission code rate may be the maximum transmission code rate that satisfies the bit error rate/frame error rate (BER/FER) that is targeted in a signal to noise ratio (SNR) in which the L1 signaling operates.

Accordingly, the transmission code rate in the case where the number of input bits input to the encoder 220 is $K_{th}$ and all the LDPC parity bits generated through the LDPC encoding are transmitted should be lower than $R_t$. Accordingly, $K_{th}$ may be determined to satisfy Equation 6 below.

$$\frac{K_{th} + N_{bch\_parity}}{(K_{th} + N_{bch\_parity}) + N_{parity}} < R_t \quad (6)$$

A detailed example of $K_{th}$ according to the required transmission code rate may be as described in Table 1 and Table 2. In Table 1 and Table 2, it is assumed that the segmented L1 signaling is formed of $K_{th}$ bits.

Table 1 indicates $K_{th}$ values according to the code rate $R_{ldpc}$ used during the LDPC encoding in the case where the required transmission code rate $R_t$ is 0.4.

TABLE 1

| $R_{ldpc}$ | $N_{parity}$ | $R_t$ | $K_{th}$ |
|---|---|---|---|
| 1/3 | 10800 | 0.4 | 7032 |
| 2/5 | 9720 | 0.4 | 6312 |
| 7/15 | 8640 | 0.4 | 5592 |
| 8/15 | 7560 | 0.4 | 4872 |
| 3/5 | 6480 | 0.4 | 4152 |
| 2/3 | 5400 | 0.4 | 3432 |
| 11/15 | 4320 | 0.4 | 2712 |

Table 2 indicates $K_{th}$ values according to the code rate $R_{ldpc}$ used during the LDPC encoding in the case where the required transmission code rate $R_t$ is 0.3.

TABLE 2

| $R_{ldpc}$ | $N_{parity}$ | $R_t$ | $K_{th}$ |
|---|---|---|---|
| 1/3 | 10800 | 0.3 | 4460 |
| 2/6 | 9720 | 0.3 | 3997 |
| 7/15 | 8640 | 0.3 | 3534 |
| 8/15 | 7560 | 0.3 | 3072 |
| 3/5 | 6480 | 0.3 | 2609 |
| 2/3 | 5400 | 0.3 | 2146 |
| 11/15 | 4320 | 0.3 | 1683 |

As the value $K_{th}$ becomes smaller, the number of segmented L1 signalings becomes larger. Accordingly, according to the present embodiment, values $R_{ldpc}$ and $K_{th}$ may be determined such that the segmentation is not maximally generated, in consideration of the range of the length of the variable L1 signaling.

As an example, if $N_{ldpc}$ (the length of an LDPC codeword) =16200, $N_{parity}$=8640, and the required transmission code rate $R_t$ is 0.4, $K_{th}$ becomes $K_{th}$=5592, and thus Equation 1 can be expressed as in Equation 7 below.

$$N_{post\_FEC\_block} = \left\lceil \frac{K_{post\_ex\_pad}}{5592} \right\rceil \quad (7)$$

Figure 7A:
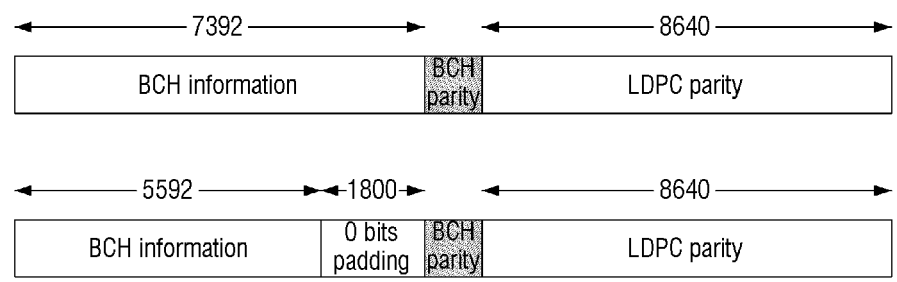
FIGS. 7A and 7B are diagrams explaining a segmented L1 signaling, according to exemplary embodiments.

An LDPC codeword that is generated on the basis of Equation 7 is as shown in FIG. 7A. Referring to FIG. 7A, in order to generate an LDPC codeword that is formed of 16200 bits through performing of LDPC encoding at a code rate of 7/15, the length of an information word that is required during the LDPC encoding becomes 7560. In this case, the length of LDPC parity bits may be 8640. Accordingly, the length of an information word that is required during BCH encoding becomes a value that is obtained by subtracting the length of BCH parity bits from the length of the information word of the LDPC encoding, i.e., 7560−168=7392.

In the case of segmenting the L1 signaling such that the maximum number of bits of the segmented L1 signaling becomes 5592, the required transmission code rate of 0.4 can be satisfied. That is, 8640 LDPC parity bits are generated through encoding of the segmented L1 signaling that is formed of 5592 bits. In this case, since the transmission code rate in the case where 8640 LDPC parity bits are all transmitted becomes 5592/(5592+8640), the required transmission code rate of 0.4 can be satisfied.

As another example, if $N_{ldpc}$=16200 and $N_{parity}$=8640, and the required code rate is 0.3, $K_{th}$=3534, and Equation 1 can be expressed as in Equation 8 below.

$$N_{post\_FEC\_block} = \left\lceil \frac{K_{post\_ex\_pad}}{3534} \right\rceil \quad (8)$$

Figure 7B:
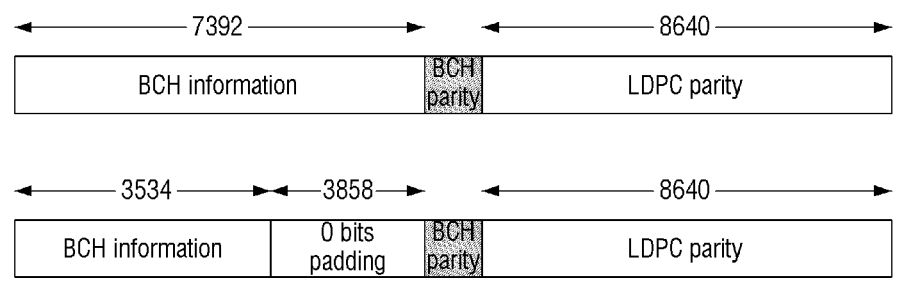

An LDPC codeword that is generated on the basis of Equation 8 is as shown in FIG. 7B. Referring to FIG. 7B, in order to generate an LDPC codeword that is formed of 16200 bits through performing of LDPC encoding at a code rate of 7/15, the length of an information word that is required during the LDPC encoding becomes 7560. In this case, the length of LDPC parity bits may be 8640. Accordingly, the length of an information word that is required during BCH encoding becomes a value that is obtained by subtracting the length of BCH parity bits from the length of the information word of the LDPC encoding, i.e., 7560−168=7392.

In the case of segmenting the L1 signaling such that the maximum number of bits of the segmented L1 signaling becomes 3534, the required transmission code rate of 0.3 can be satisfied. That is, 8640 LDPC parity bits are generated through encoding of the segmented L1 signaling that is formed of 3534 bits. In this case, since the transmission code rate in the case where 8640 LDPC parity bits are all transmitted becomes 3534/(3534+8640), the required transmission code rate of 0.3 can be satisfied.

As described above, according to the present embodiment, the L1 signaling can be segmented such that the required length of the information word becomes smaller than the length of the information word of the BCH codeword or the length of the information word of the LDPC codeword to satisfy the required transmission code rate.

FIGS. 7A and 7B illustrate that zero bits are added after the BCH information word. However, this is merely exemplary, and the position to which the zero bits are added may be variously changed.

The segmenter 210 may perform segmentation of the L1 signaling using a method that is different from the above-described method. This will be described in more detail with reference to FIG. 8.

Figure 8:
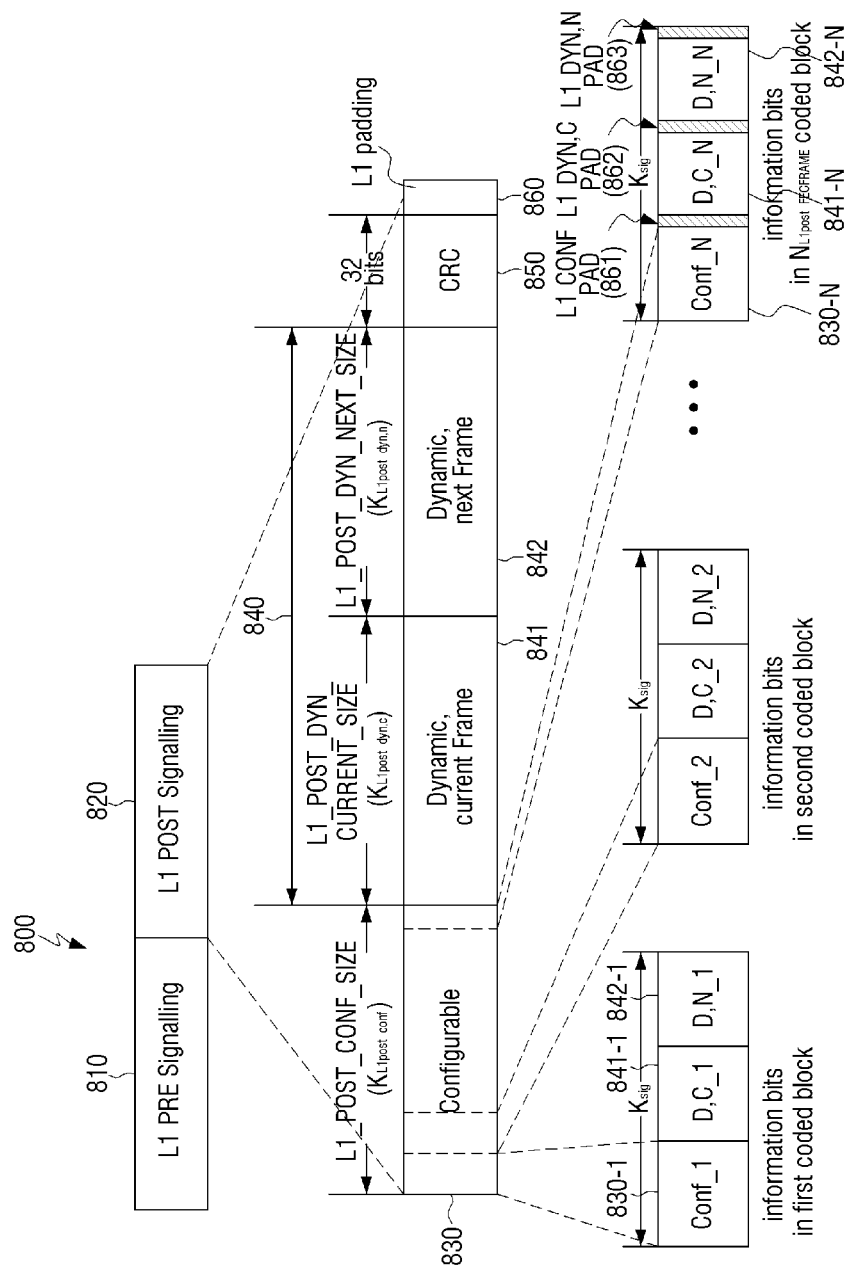
FIG. 8 is a diagram explaining a method for segmenting an L1 signaling, according to another exemplary embodiment.

FIG. 8 is a diagram explaining a method for segmenting L1 signaling according to another exemplary embodiment. Referring to FIG. 8, the L1 signaling 800 may include L1 pre signaling 810 and L1 post signaling 820.

The L1 pre signaling 810 includes information that is scarcely changed in time. For example, the L1 pre signaling 810 may include a cell identifier, a network identifier, the number of frequencies, a frame length, and a position of a pilot sub-carrier.

As illustrated in FIG. 8, the L1 post signaling 820 may include L1 variable information 830 and L1 dynamic information 840. Here, the L1 variable information 830 may be referred to as L1 configurable information.

The L1 variable information 830 is not changed on a frame by frame basis, but may include information that may be changed in a frame to be transmitted, for example, information on a PLP identifier, a modulation order used for the PLP transmission, and a code rate.

The L1 dynamic information 840 may include information that may be changed for each frame, for example, information on what position of a frame a PLP for transmitting service data is transmitted, i.e., information on a start point and an end point of the PLP.

Specifically, the L1 dynamic information may include L1 dynamic information 842 about a current frame that indicates the L1 dynamic information about the current frame, and L1 dynamic information 842 about a next frame that indicates the L1 dynamic information about a frame to be subsequently transmitted. For example, if the current frame is the K-th frame, the L1 dynamic information about the next frame that is transmitted at the K-th frame includes the same value as the value of the L1 dynamic information to be transmitted at the (K+1)-th frame.

As illustrated in FIG. 8, the L1 post signaling 840 may further include a CRC 850 and an L1 padding 860 in addition to the L1 variable information 830 and the L1 dynamic information 840. Here, the CRC 850 may include parity bits that are generated through application of CRC coding to the L1 variable information 830 and the L1 dynamic information 840, and the L1 padding 860 may include bits that are added in order to segment the L1 post signaling 820 with the same length.

If the L1 post signaling has a structure as shown in FIG. 8, the segmenter 220 may perform segmentation by type of information that forms the L1 post signaling. Specifically, the segmenter 210 may segment each of L1 variable information, L1 dynamic information about a current frame, and L1 dynamic information about a next frame that form the L1 post signaling, and then may construct input bits (i.e., $K_{sig}$) input to the encoder 220 using the information segmented by information type.

Hereinafter, if the L1 post signaling has the structure as shown in FIG. 8, a method for segmenting the L1 post signaling will be described in more detail.

First, the segmenter 210 calculates the number of LDPC blocks $N_{post\_FECFRAME}$ On the basis of Equation 9. Here, the number of LDPC blocks may be the number of segmented L1 signalings.

$$N_{L1post\_FECFRAME} = \left\lceil \frac{K_{L1post\_ex\_pad}}{N_{L1post\_segmentation}} \right\rceil, \quad (9)$$

where $K_{L1post\_ex\_pad}$ is the length of the L1 post signaling. Specifically, $K_{L1post\_ex\_pad}$ is the length of the L1 post signaling not including the L1 padding, and thus may be a value that is obtained by adding the length $K_{post\_conf}$ of the L1 variable information, the length $K_{L1post\_dyn,c}$ of the L1 dynamic information about the current frame, the length $K_{L1post\_dyn,n}$ of the L1 dynamic information about the next frame, and the length of the CRC. That is, $K_{L1post\_ex\_pad} = K_{post\_conf} + K_{L1post\_dyn,c} + K_{L1post\_dyn,n} + 32$.

Then, $N_{L1post\_segmentation}$ is the maximum number of bits of the segmented L1 post signaling, and may be defined as in Equation 10 below.

$$N_{L1post\_segmentation} = \left\lfloor \frac{R_t}{1-R_t} \cdot N_{parity} \right\rfloor - N_{bch\_parity} - A = K_{th} - A \quad (10)$$

As described above, $N_{L1post\_segmentation}$ has a value that is smaller than $K_{th}$ by A. That is, in the case of performing segmentation by type of information that forms the L1 post signaling, the maximum length of the input bits input to the encoder 220 may be a value that is smaller than $K_{th}$ by A.

Here, A is a correction factor that makes the number of bits of the information (i.e., the number of bits of the L1 post signaling in the LDPC block that is equal to the number of input bits of the encoder 220) in the LDPC block after the segmentation equal to smaller than $K_{th}$, and can be changed according to the number of signaling types being segmented. For example, in the case of performing segmentation through division of the L1 post signaling into L1 variable information 830, L1 dynamic information 841 of the current frame, and L1 dynamic information 842 of the next frame, the segmentation is performed through division into three kinds of information, and thus A becomes 3−1=2.

The L1 post signaling may be divided into L1 variable information, L1 dynamic information about the current frame, and L1 dynamic information about the next frame, and if the L1 dynamic information about the next frame is not used, it may be divided into L1 variable information and L1 dynamic information about the current frame.

Accordingly, in the case where the L1 post signaling is divided into L1 variable information, L1 dynamic information about the current frame, and L1 dynamic information about the next frame, and the segmentation is performed by type, $N_{L1post\_segmentation}$ may be a value that is smaller than $K_{th}$ by two (2) bits, and in the case where the L1 post signaling is divided into L1 variable information and L1 dynamic information about the current frame, and the segmentation is performed by type, $N_{L1post\_segmentation}$ may be a value that is smaller than $K_{th}$ by one (1) bit.

Accordingly, in the case where the L1 post signaling is divided into L1 variable information, L1 dynamic information about the current frame, and L1 dynamic information about the next frame, Table 1 and Table 2 as described above may be corrected to Table 3 and Table 4, respectively, and in the case where the L1 post signaling is divided into L1 variable information and L1 dynamic information about the current frame, Table 1 and Table 2 as described above may be corrected to Table 5 and Table 6, respectively.

TABLE 3

| $R_{ldpc}$ | $N_{parity}$ | $R_t$ | $K_{th}$ |
|---|---|---|---|
| 1/3 | 10800 | 0.4 | 7030 |
| 2/5 | 9720 | 0.4 | 6310 |

TABLE 3-continued

| $R_{ldpc}$ | $N_{parity}$ | $R_t$ | $K_{th}$ |
|---|---|---|---|
| 7/15 | 8640 | 0.4 | 5590 |
| 8/15 | 7560 | 0.4 | 4870 |
| 3/5 | 6480 | 0.4 | 4150 |
| 2/3 | 5400 | 0.4 | 3430 |
| 11/15 | 4320 | 0.4 | 2710 |

TABLE 4

| $R_{ldpc}$ | $N_{parity}$ | $R_t$ | $K_{th}$ |
|---|---|---|---|
| 1/3 | 10800 | 0.3 | 4458 |
| 2/5 | 9720 | 0.3 | 3995 |
| 7/15 | 8640 | 0.3 | 3532 |
| 8/15 | 7560 | 0.3 | 3070 |
| 3/5 | 6480 | 0.3 | 2607 |
| 2/3 | 5400 | 0.3 | 2144 |
| 11/15 | 4320 | 0.3 | 1681 |

TABLE 5

| $R_{ldpc}$ | $N_{parity}$ | $R_t$ | $K_{th}$ |
|---|---|---|---|
| 1/3 | 10800 | 0.4 | 7031 |
| 2/5 | 9720 | 0.4 | 6311 |
| 7/15 | 8640 | 0.4 | 5591 |
| 8/15 | 7560 | 0.4 | 4871 |
| 3/5 | 6480 | 0.4 | 4151 |
| 2/3 | 5400 | 0.4 | 3431 |
| 11/15 | 4320 | 0.4 | 2711 |

TABLE 6

| $R_{ldpc}$ | $N_{parity}$ | $R_t$ | $K_{th}$ |
|---|---|---|---|
| 1/3 | 10800 | 0.3 | 4459 |
| 2/5 | 9720 | 0.3 | 3996 |
| 7/15 | 8640 | 0.3 | 3533 |
| 8/15 | 7560 | 0.3 | 3071 |
| 3/5 | 6480 | 0.3 | 2608 |
| 2/3 | 5400 | 0.3 | 2145 |
| 11/15 | 4320 | 0.3 | 1682 |

However, even if $N_{L1post\_segmentation}$ is defined as a value that is smaller than $K_{th}$ by one (1) or two (2), the transmission code rate is slightly improved in comparison to the required transmission code rate in the case of $K_{th}$, and thus $N_{L1post\_segmentation}$ may be defined as the same value as $K_{th}$. In this case, Table 1 and Table 2 may be applied to this embodiment as they are.

Thereafter, the segmenter 210 calculates the number of padding bits (i.e., L1 padding) $K_{L1\_PADDING}$ to be added (or padded) to the L1 post signaling for the segmentation based on Equation 11 below.

$$N_{L1post\_PADDING} = K_{L1post\_conf\_PAD} + K_{L1post\_dyn,c\_pad} + K_{L1post\_dyn,n\_PAD} \quad (11)$$

where $K_{L1post\_conf\_PAD}$ is the length of the padding bits of the L1 variable information, $K_{L1post\_dyn,c\_PAD}$ is the length of the padding bits of the L1 dynamic information about the current frame, and $K_{L1post\_dyn,n\_PAD}$ is the length of the padding bits of the L1 dynamic information about the next frame that includes the CRC.

The length of the padding bits of the L1 variable information, the length of the padding bits of the L1 dynamic information about the current frame, and the length of the padding bits of the L1 dynamic information about the next frame that includes the CRC may be calculated on the basis of Equations 12 to 14 below.

$$N_{L1post\_conf\_PAD} = \left\lceil \frac{K_{L1post\_conf}}{N_{L1post\_FECFRAME}} \right\rceil \times N_{L1post\_FECFRAME} - K_{L1post\_conf}, \quad (12)$$

$$N_{L1post\_dyn,c\_PAD} = \left\lceil \frac{N_{L1post\_dyn,c}}{N_{L1post\_FECFRAME}} \right\rceil \times N_{L1post\_FECFRAME} - N_{L1post\_dyn,c}, \quad (13)$$

$$N_{L1post\_dyn,n\_PAD} = \left\lceil \frac{K_{L1post\_dyn,n} + 32}{N_{L1post\_FECFRAME}} \right\rceil \times N_{L1post\_FECFRAME} - (K_{L1post\_dyn,n} + 32), \quad (14)$$

where $K_{L1post\_conf}$ is the length of the L1 variable information, $K_{L1post\_dyn,c}$ is the length of the L1 dynamic information about the current frame, $K_{L1post\_dyn,n}$ is the length of the L1 dynamic information about the next frame, and 32 is the length of the CRC. Further, $N_{post\_FECFRAME}$ is the number of LDPC blocks.

According to circumstances, the L1 dynamic information about the next frame may not be used (i.e., $K_{L1post\_dyn,n}=0$), and in this case, the length of the padding bits may be calculated on the basis of Equations 15 to 17 below.

$$N_{L1post\_conf\_PAD} = \left\lceil \frac{K_{L1post\_conf}}{N_{L1post\_FECFRAME}} \right\rceil \times N_{L1post\_FECFRAME} - K_{L1post\_conf}, \quad (15)$$

$$N_{L1post\_dyn,c\_PAD} = \left\lceil \frac{K_{L1post\_dyn,c} + 32}{N_{L1post\_FECFRAME}} \right\rceil \times N_{L1post\_FECFRAME} - (K_{L1post\_dyn,c} + 32) \quad (16)$$

$$N_{L1post\_dyn,n\_PAD} = 0. \quad (17)$$

Thereafter, the segmenter 210 may add the padding bits to the L1 post signaling, and segment the L1 signaling to which the padding bits are added. In this case, the segmenter 210 may add the padding bits that are calculated by type to the information of the respective types and segment the information of the respective types to which the padding bits are added, respectively.

For this, the segmenter 210 calculates the length $K_{L1post}$ of the L1 signaling to which the padding bits are added based on Equation 18 below, and calculates the length $K_{sig}$ of the segmented L1 signaling based on Equation 19 below.

$$K_{L1post} = K_{L1post\_ex\_pad} + K_{L1post\_PADDING}, \quad (18)$$

$$K_{sig} = \frac{K_{L1post}}{N_{L1post\_FECFRAME}} \quad (19)$$

The segmenter 210 may perform segmentation by type of information that forms the L1 post signaling as described above. Specifically, the segmenter 210 may segment the L1 variable information, the L1 dynamic information about the current frame, and the L1 dynamic information about the next frame, and then may construct input bits that are input to the encoder 220 using the information segmented with respect to respective types. Here, the number $K_{sig}$ of input bits that are input to the encoder 220 may be a value calculated by Equation 19.

Hereinafter, a method for forming the input bits having the length of $K_{sig}$ through segmentation of the respective types of information will be described in more detail. Here, since the input bits are encoded by the encoder 220, the input bits may be information words included in the respective encoded blocks.

Specifically, the input bits input to the encoder 220 may be formed of the respective types of segmented information.

For example, as shown in FIG. 8, the first input bits may be formed of first segmented L1 variable information 830-1, first segmented L1 dynamic information 841-1 about the current frame, and first segmented L1 dynamic information 842-1 about the next frame. Here, the first segmented L1 variable information 830-1 may be formed in the above-described method through $\lceil K_{L1post\_conf}/N_{L1post\_FECFRAME}\rceil$-$K_{L1post\_conf\_PAD}$ in the above-described method.

The $N_{post\_FECFRAME}$-th input bits may be formed of the N-th segmented L1 variable information 830-N, the N-th segmented L1 dynamic information 841-N about the current frame, the N-th segmented L1 dynamic information 842-N about the next frame, and the padding bits. Here, the padding bits may be padding bits 861 of the L1 variable information, padding bits 862 of the L1 dynamic information about the current frame, and padding bits 863 of the L1 dynamic information about the next frame including the CRC.

Accordingly, the N-th segmented L1 variable information 830-N may be formed of $\lceil K_{L1post\_conf}/N_{L1post\_FECFRAME}\rceil$-$K_{L1post\_conf\_PAD}$ bits, the N-th segmented L1 dynamic information 841-N about the current frame may be formed of $\lceil K_{L1post\_dyn,c}/N_{L1post\_FECFRAME}\rceil$-$K_{L1post\_dyn,c\_PAD}$ bits, and the N-th segmented L1 dynamic information 842-N about the next frame may be formed of $\lceil (K_{L1post\_dyn,n}+32)/N_{L1post\_FECFRAME}\rceil$-$K_{L1post\_dyn,n\_PAD}$ bits including partial bits constituting the CRC 850.

As described above, the segmenter 210 may segment the information by type of information that forms the L1 post signaling according to the above-described method, and may generate a plurality of segmented L1 post signalings each of which is formed of $K_{sig}$ bits. Further, the segmenter 210 may output the plurality of segmented L1 post signalings to the encoder 220. Accordingly, each of a plurality of LDPC codewords generated through encoding by the encoder 220 may include $K_{sig}$ L1 post signaling bits.

However, dividing the L1 post signaling into different types of information and segmenting each type of information in the above-described method is merely exemplary. That is, the L1 post signaling may be divided in such a manner that the L1 variable information is one type and the L1 dynamic information about the current frame and the L1 dynamic information about the next frame is the other type. That is, the method of dividing the L1 post signaling for segmentation purposes is not being limited to the above embodiments.

Figure 9:
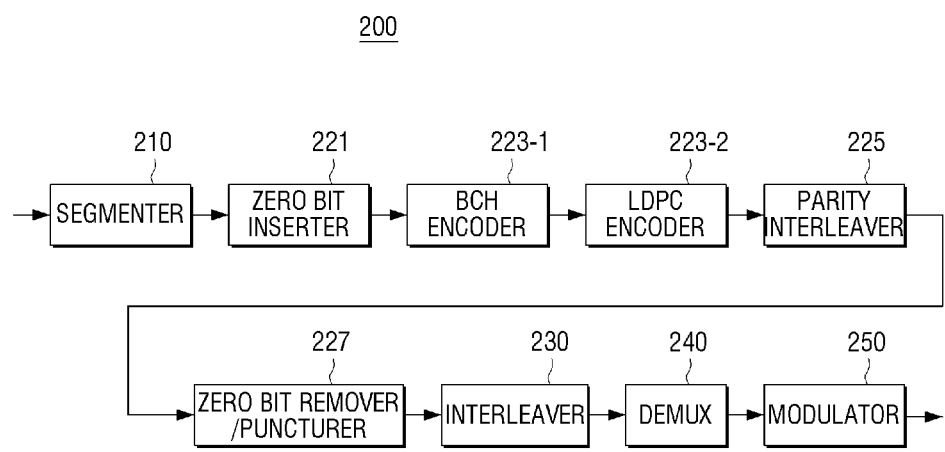
FIG. 9 is a diagram illustrating a detailed configuration of a transmitter, according to an exemplary embodiment.

FIG. 9 is a diagram illustrating the detailed configuration of a transmitter according to an exemplary embodiment. Referring to FIG. 9, the transmitter 200 includes a segmenter 210, a zero bit inserter 221, a BCH encoder 223-1, an LDPC encoder 223-2, a parity interleaver 225, a zero bit remover/puncturer 227, an interleaver 230, a demultiplexer (DE-MUX) 240, and a modulator 250. Here, the segmenter 210, the zero bit inserter 221, the BCH encoder 223-1, the LDPC encoder 223-2, the parity interleaver 225, and the zero bit remover/puncturer 227 are the same as those as described above with reference to FIGS. 1 to 8, and the detailed description thereof will be omitted.

The interleaver 230 may interleave the L1 signaling. Specifically, the interleaver 230 may interleave respective LDPC codewords output from the encoder 220 using $N_c$ columns formed of $N_r$ rows.

Specifically, the interleaver 230 may perform interleaving by writing the LDPC codeword bits output from the encoder 220 in a column direction from the first column to the $N_c$-th column, and reading the LDPC codeword bits in a row direction from the first row to the $N_r$-th row of the plurality of rows on which the LDPC codeword bits are written. Accordingly, the bits that are written on the same row of the respective columns are sequentially output, and the order of the LDPC codeword bits may be realigned in comparison with those before the interleaving.

The interleaver 230 may selectively perform interleaving according to a modulation method. For example, the interleaver 230 can interleave the LDPC codewords only in the case where the modulation method is 16-QAM, 64-QAM, or 256-QAM.

The number $N_c$ of columns and the number $N_r$ of rows that forms the interleaver 230 may be variously changed according to a code rate and the modulation method. For example, if the code rate of the LDPC code is 7/15, the number $N_c$ of columns is equal to the order of modulation of the L1 post signaling, and the number $N_r$ of rows may be the (number of bits of the LDPC codeword)/$N_c$. That is, if the number of bits of the LDPC codeword is $N_{L1post}$ and the modulation method is 16-QAM, 64-QAM, or 256-QAM, the order of modulation may become 4, 6, or 8, and thus the number $N_c$ of columns may become 4, 6, or 8, while the number $N_r$ of rows may become $N_{L1post}/4$, $N_{L1post}/6$, or $N_{L1post}/8$.

The DEMUX 240 demultiplexes the LDPC codeword transmitted from the interleaver 230. Specifically, the DEMUX 240 may demultiplex the interleaved LDPC codeword into a cell (or data cell) having a predetermined number of bits through performing of bit-to-cell conversion of the interleaved LDPC codeword.

For example, the DEMUX 240 may convert the LDPC codeword bits into cells by sequentially outputting the LDPC codeword bits output from the interleaver 230 to one of a plurality of sub-streams to output the cell. In this case, the bits having the same indexes in the plurality of sub-streams may constitute the same cell.

Here, the number of sub-streams is equal to the number of bits that constitute the cell. For example, if the modulation method is 16-QAM, 64-QAM, or 256-QAM, the number of sub-streams may become 1, 2, 3, 6, or 8, and the number of cells may become $N_{L1post}$, $N_{L1post}/2$, $N_{L1post}/4$, $N_{L1post}/6$, or $N_{L1post}/8$. Here, $N_{L1post}$ is the number of bits of the LDPC codeword output from the encoder 220. That is, $N_{L1post}$ is the number of bits that constitute the LDPC codeword after the puncturing and shortening are performed.

The DEMUX 220 may selectively perform demultiplexing according to the modulation method. For example, if the modulation method is BPSK, the DEMUX 240 may not perform demultiplexing.

The modulator 250 may modulate cells output from the DEMUX 240. Specifically, the modulator 250 may modulate the cells output from the DEMUX 240 through mapping on the constellation point using various modulation methods, such as BPSK, QPSK, 16-QAM, 64-QAM, and 256-QAM. Here, if the modulation methods are BPSK, QPSK, 16-QAM, 64-QAM, and 256-QAM, the number of bits that constitute the modulated cell (i.e., modulated symbol) may be 1, 2, 4, 6, and 8.

The transmitter 200 may transmit the modulated symbol to a receiver (not illustrated). For example, the transmitter 200 may map the modulated symbol on a frame using the OFDM method, and may transmit this to the receiver through an allocated channel. In this case, the modulated symbol of the L1 signaling may be mapped on an OFDM preamble in the frame.

Figure 10:
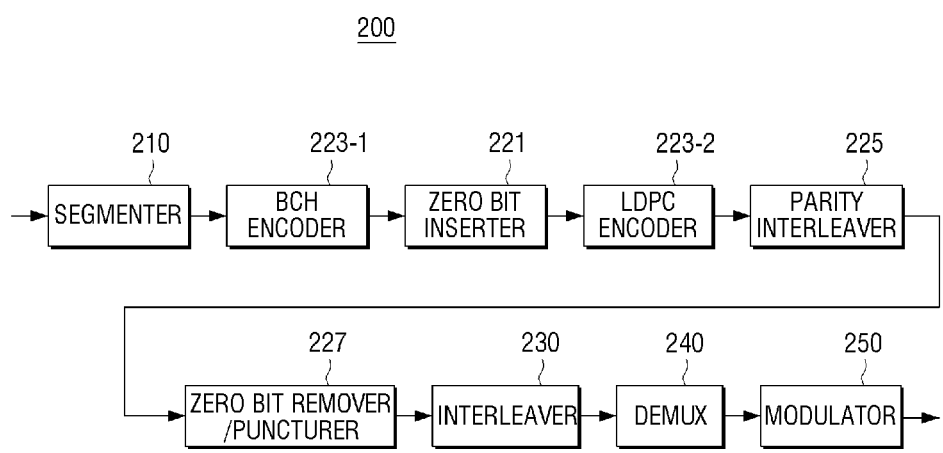
FIG. 10 is a block diagram illustrating a configuration of a transmitter, according to another exemplary embodiment.

In the above-described example, it is described that the zero bit inserter 221 is arranged in front of the BCH encoder 223-1. However, this is merely exemplary, and as shown in FIG. 10, the zero bit inserter 221 may be arranged between the BCH encoder 223-1 and the LDPC encoder 223-2. In this case, although the arrangement of the constituent elements differs, the constituent elements perform the same operation. Accordingly, the configuration in FIG. 10 will be described with regard to different aspects compared to FIG. 9.

Referring to FIG. 10, the BCH encoder 223-2 may generate a plurality of BCH codewords by performing BCH encoding of the segmented L1 signaling output from the segmenter 210, and may output the BCH codewords to the zero bit inserter 221. The zero bit inserter 221 pads zero bits to the BCH codewords, and outputs the BCH codeword to which the zero bits are padded to the LDPC encoder 223-2. For example, if the length of the BCH codewords is $N_{bch}$ ($=K_{sig}+N_{bch\_parity}$) and the length of an information word that is required during LDPC encoding is $K_{ldpc}$, the zero bit inserter 221 may pad the zero bits to the BCH codeword by $K_{ldpc}-N_{bch}$. Here, $K_{sig}$ is the length of a segmented L1 signaling, and $N_{bch\_parity}$ is the length of BCH parity bits.

The LDPC encoder 223-1 may generate LDPC codewords through performing of the LDPC encoding with respect to the BCH codewords to which the zero bits are padded, and may output the generated LDPC codewords to the parity interleaver 430. In this case, since a BCH codeword to which the zero bits are padded is formed of Kldpc bits, the LDPC encoder 223-1 may generate a plurality of LDPC codewords each having the length of Nldpc through performing of LDPC encoding with respect to the BCH codewords to which the zero bits are padded.

Further, although not illustrated in FIGS. 9 and 10, the transmitter 200 may further include a scrambler (not illustrated). The scrambler (not illustrated) may randomize input bits to output the randomized bits. The scrambler (not illustrated) that performs the above-described function may be arranged between the segmenter 230 and the zero bit inserter 221 in the case of FIG. 9, and may be arranged between the segmenter 230 and the BCH encoder 223-1 in the case of FIG. 10.

The transmitter 200 according to another exemplary embodiment may further include a controller (not illustrated) for controlling the whole operations of the transmitter 200.

Specifically, the controller may calculate various kinds of parameters for controlling operations that are performed by the respective constituent elements of the transmitter 200, and may provide the calculated parameters to the respective constituent elements. Accordingly, the segmenter 210, the encoder 220, the interleaver 230, the DEMUX 240, and the modulator 250 may perform their operations using information transmitted from the controller.

For example, the controller (not illustrated) may calculate a length by which the L1 signaling is segmented to provide the calculated length to the segmenter 210, and may calculate the number of zero bits that are added to or removed from the segmented L1 signaling to provide the calculated number of zero bits to the encoder 220. Further, the controller may provide a code rate that is used during the BCH and LDPC encoding and information on the length of a codeword to the encoder 220. Further, the controller may provide information on an interleaving method to the interleaver 230, provide information on a demultiplexing method to the DEMUX 240, and provide information on a modulation method to the modulator 250.

Figure 11A:
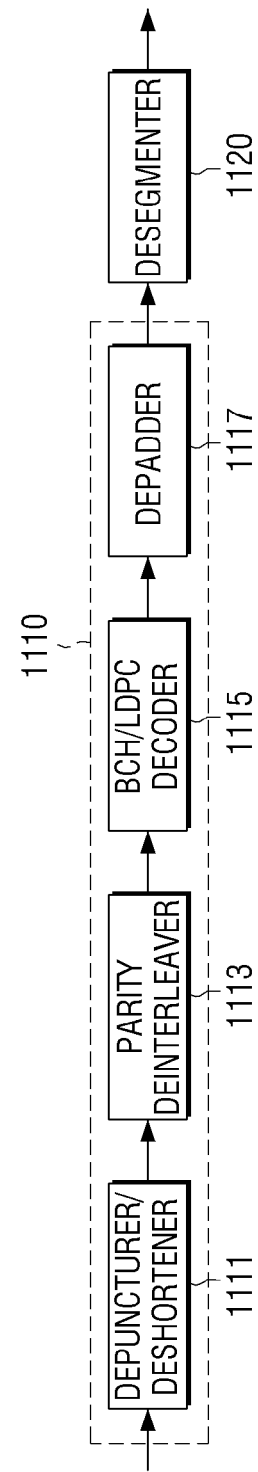
FIGS. 11A and 11B are block diagrams illustrating a configuration of a receiver according to an exemplary embodiment.
Figure 11B:
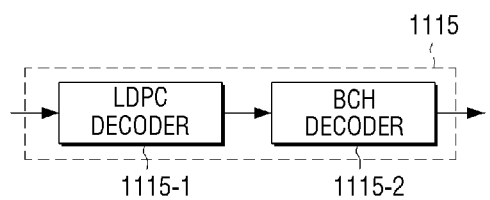

FIGS. 11A and 11B are block diagrams illustrating a configuration of a receiver, according to an exemplary embodiment. First, referring to FIG. 11A, a receiver 1100 includes a decoder 1110 and a desegmenter 1120.

The decoder 1110 may perform LDPC and BCH decoding on the basis of a channel value of a signal received from the transmitter 200. Here, an example of the channel value of the received signal may be a log likelihood ratio (LLR) value.

The received signal may have been segmented by the transmitter 200 to have bits the number of which is equal to or smaller than a predetermined number, and may include an L1 signaling on which the BCH and LDPC encoding was performed. Here, the L1 signaling may be an L1 post signaling.

Here, the predetermined number may be a value that is smaller than a length of an information word of the BCH encoding or a length of an information word of the LDPC encoding, and specifically, the predetermined number may be determined on the basis of the required transmission code rate, the number of parity bits generated through the BCH encoding, and the number of parity bits generated through the LDPC encoding.

As an example, the predetermined number may be calculated on the basis of Equation 20 below.

$$K_{th} = \left\lfloor \frac{R_t}{1-R_t} \cdot N_{parity} \right\rfloor - N_{bch\_parity}, \quad (20)$$

where $K_{th}$ is the predetermined number presented according to the present embodiment, $N_{parity}$ is the number of LDPC parity bits generated by the LDPC encoding, and $N_{bch\_parity}$ is the number of BCH parity bits generated by the BCH encoding. Further, $R_t$ is a required transmission code rate in the case where the segmented L1 signaling is formed of $K_{th}$ bits. This has been described in detail in relation to Equation 5.

The decoder 1110 is a constituent element that corresponds to the encoder 220 of the transmitter 200, and performs an operation that corresponds to that of the encoder 220. For this, the decoder 1110 may include a depuncturer/deshortener 1111, a parity deinterleaver 1113, a BCH/LDPC decoder 1115, and depadder 1117.

The depuncturer/deshortener 1111 is a constituent element that corresponds to the zero bit inserter 221 and the zero bit remover/puncturer 227 of the transmitter 200, and performs an operation that corresponds to that of the zero bit inserter 221 and the zero bit remover/puncturer 227.

Specifically, the depuncturer/deshortener 1111 may add an LLR value that corresponds to zero bits, which are added by the zero bit inserter 221 and then are removed by the zero bit remover/puncturer 227, to the LLR value of the signal received from the transmitter 200.

That is, the depuncturer/deshortener 1111 may add the LLR value that corresponds to the zero bits shortened on the basis of information about the positions, the number, and the bit values of the shortened zero bits. Here, the LLR value that corresponds to the shortened zero bits may be $+\infty$ or $-\infty$. The information about the positions, the number, and the bit values of the zero bits that are shortened by the transmitter 200 may be pre-stored in the receiver 1100 or may be provided from the transmitter 200. Accordingly, the depuncturer/deshortener 1111 may insert the LLR value as large as the corresponding number into the positions where the shortened zero bits existed.

Further, the depuncturer/deshortener 1111 may add the LLR value that corresponds to the bits, which are punctured by the zero bit remover/puncturer 227, to the LLR value of the signal received from the transmitter 200.

That is, the depuncturer/deshortener 1111 may add the LLR value that corresponds to the punctured bits on the basis of the information about the positions and the number of the punctured LDPC parity bits. Here, the LLR value that corresponds to the punctured bits may be zero. The information about the positions and the number of the LDPC parity bits punctured by the transmitter 200 may be pre-stored in the receiver 1100 or may be provided from the transmitter 200. Accordingly, the depuncturer/deshortener 1111 may insert the LLR value as large as the corresponding number into the positions where the punctured LDPC parity bits existed.

As described above, the depuncturer/deshortener 1111 may add the LLR value that corresponds to the bits shortened and punctured by the transmitter 200 and may output a resultant value to the parity deinterleaver 1113.

The parity deinterleaver 1113 performs parity deinterleaving with respect to the output value of the depuncturer/deshortener 1111 and may output a resultant value to the BCH/LDPC decoder 1115.

Specifically, the parity deinterleaver 1113 is a constituent element that corresponds to the parity interleaver 225 of the transmitter 200, and performs an operation that corresponds to that of the parity interleaver 225. That is, the parity deinterleaver 1113 may deinterleave the LLR value that corresponds to the LDPC parity bits among the LLR values output from the depuncturer/deshortener 1111 by reversely performing the interleaving operation that is performed by the parity interleaver 225.

However, according to circumstances, if the parity interleaver 225 is omitted from the transmitter 200, the parity deinterleaver 1113 of the receiver 1100 may also be omitted.

The BCH/LDPC decoder 1115 performs BCH and LDPC decoding on the basis of the output value of the parity deinterleaver 1113.

Specifically, the BCH/LDPC decoder 1115 is a configuration that corresponds to the BCH/LDPC encoder 223 of the transmitter 200, and may perform an operation that corresponds to that of the BCH/LDPC encoder 223.

For this, as illustrated in FIG. 11B, the BCH/LDPC decoder 1115 may include an LDPC decoder 1115-1 for performing LDPC decoding and a BCH decoder 1115-2 for performing BCH decoding.

That is, the LDPC decoder 1115-1 performs LDPC decoding on the basis of the output value of the parity interleaver 1113 and outputs a resultant value of decoding to the BCH decoder 1115-2.

Specifically, the LDPC decoder 1115-1 is a constituent element that corresponds to the LDPC encoder 223-2 of the transmitter 200, and performs an operation that corresponds to that of the LDPC encoder 223-2. For example, the LDPC decoder 1115-1 may correct an error by performing LDPC decoding using the LLR value that is output from the parity deinterleaver 1113 on the basis of iterative decoding based on a sum-product algorithm.

Here, the sum-product algorithm is an algorithm that exchanges messages (e.g., LLR values) through edges on a bipartite graph of a message passing algorithm, and calculates output messages from the messages input from variable nodes or check nodes to update the messages.

The BCH decoder 1115-2 performs BCH decoding with respect to the output value of the LDPC decoder 1115-1 and outputs a resultant value of decoding to the depadder 1117.

Here, since the output value of the LDPC decoder 1115-1 is formed of a plurality of bit strings including segmented L1 signaling bits, zero bits padded to the segmented L1 signaling, and BCH parity bits, the BCH decoder 1115-2 may correct an error using the BCH parity bits, and may output a plurality of bit strings including the segmented L1 signaling bits and the zero bits padded to the segmented L1 signaling to the depadder 1117. Here, the L1 signaling may be an L1 post signaling.

The depadder 1117 may remove the zero bits from the output value of the BCH/LDPC decoder 1115 and may output a resultant value to the desegmenter 1120.

Specifically, the depadder 1117 is a constituent element that corresponds to the zero bit inserter 221 of the transmitter 200, and may perform an operation that corresponds to that of the zero bit inserter 221. That is, the depadder 1117 may remove the zero bits added by the zero bit inserter 221 from the respective bit strings output from the BCH decoder 1115-2, and may output a plurality of segmented L1 signalings. For this, information about the positions and the number of zero bits added by the zero bit inserter 221 may be provided from the transmitter 200 or may be pre-stored in the receiver 1100.

The desegmenter (or combiner) 1120 performs desegmentation with respect to the output value of the depadder 1117.

Specifically, the desegmenter 1120 is a constituent element that corresponds to the segmenter 210 of the transmitter 200, and may perform an operation that corresponds to that of the segmenter 210. That is, since the plurality of bit strings output from the depadder 1117, i.e., a plurality of segmented L1 signalings, are segmented by the transmitter 200, the desegmenter 1120 may generate and output an L1 signaling before being segmented through desegmentation of the plurality of segmented L1 signalings.

Figure 12:
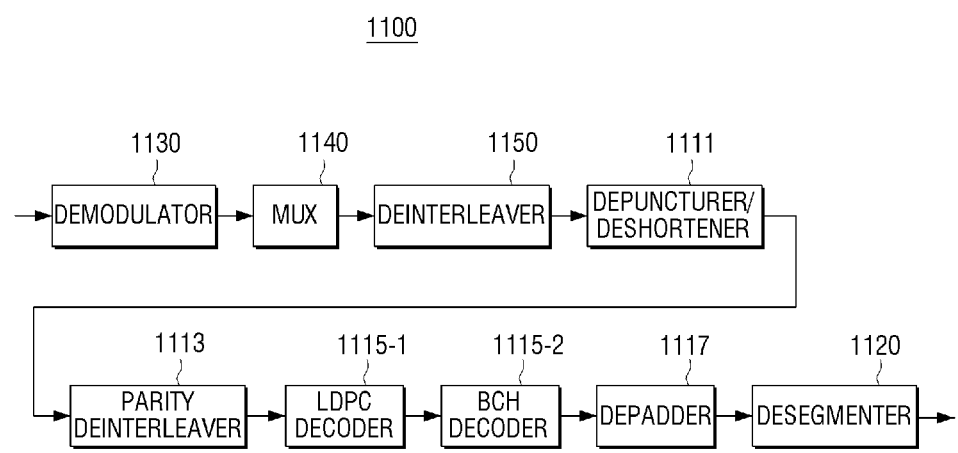
FIG. 12 is a block diagram illustrating a detailed configuration of a receiver, according to an exemplary embodiment.

FIG. 12 is a block diagram illustrating a detailed configuration of a receiver, according to an exemplary embodiment. Referring to FIG. 12, the receiver 1100 may further include a demodulator 1130, a depadder 1117, a BCH decoder 1115-2, and a desegmenter 1120 in addition to a depuncturer/deshortener 1111, a parity deinterleaver 1113, an LDPC decoder 1115-1, a depadder 1117, a BCH decoder 1115-2, and a desegmenter 1120. Here, since the depuncturer/deshortener 1111, the parity deinterleaver 1113, the LDPC decoder 1115-1, the depadder 1117, the BCH decoder 1115-2, and the desegmenter 1120 are the same as those as described above with reference to FIG. 11, the detailed description thereof will be omitted.

The demodulator 1130 receives and modulates a signal transmitted from the transmitter 200. Specifically, the demodulator 1130 may generate a value that corresponds to an LDPC codeword through demodulation of the received signal, and may output the generated value to the MUX 1140.

Here, the value that corresponds to the LDPC codeword may be expressed as a channel value. There may be various methods for determining a channel value, and as an example, a method for determining an LLR value may be included therein.

Here, the LLR value may be a value obtained by logging a ratio of a probability that a bit transmitted from the transmitter 200 is "0" to a probability that the bit is "1".

Further, the LLR value may be a representative value that is determined according to a section to which a probability that a bit transmitted from the transmitter 200 is "0" or "1" belongs.

The MUX (or multiplexer) 1140 multiplexes the output value of the demodulator 1130 and outputs the multiplexed values to the deinterleaver 1150.

Specifically, the MUX 1140 is a constituent element that corresponds to the DUMUX 240 of the transmitter 200, and may perform an operation that corresponds to that of the DEMUX 240. That is, the MUX 1140 may convert the output value of the demodulator 1130 in a cell-to-bit manner and may realign the LLR value in a unit of a bit.

The deinterleaver 1150 deinterleaves the output value of the MUX 1140 and outputs the deinterleaved value to the decoder 1110.

Specifically, the deinterleaver 1150 is a constituent element that corresponds to the interleaver 230 of the transmitter 200, and may perform an operation that corresponds to that of the interleaver 230. That is, the deinterleaver 1150 may deinterleave the output value of the MUX 1140 by reversely performing an interleaving operation that is performed by the interleaver 230.

In this case, the decoder 1110 may process the output value of the deinterleaver 1150 as described above with reference to FIG. 11. That is, the depuncturer/deshortener 1111 adds a specific value to the output value of the deinterleaver 1150 to output the value to the parity deinterleaver 1113, and the parity deinterleaver 1113 performs parity deinterleaving of the output value of the depuncturer/deshortener 1111. The BCH/LDPC decoder 1115 decodes the output value of the parity deinterleaver 1113 to output the decoded value to the depadder 1117, and the depadder 1117 removes zero bits from the output value of the BCH/LDPC decoder 1115 to output the output value to the BCH/LDPC decoder 1115, and the desegmenter 1120 desegments the output value of the depadder 1117 to restore an L1 signaling.

In the case where the transmitter 200 processes and transmits an L1 post signaling using the constituent elements as illustrated in FIG. 9, the receiver 1100 may process the L1 post signaling using the constituent elements as illustrated in FIG. 12.

Figure 13:
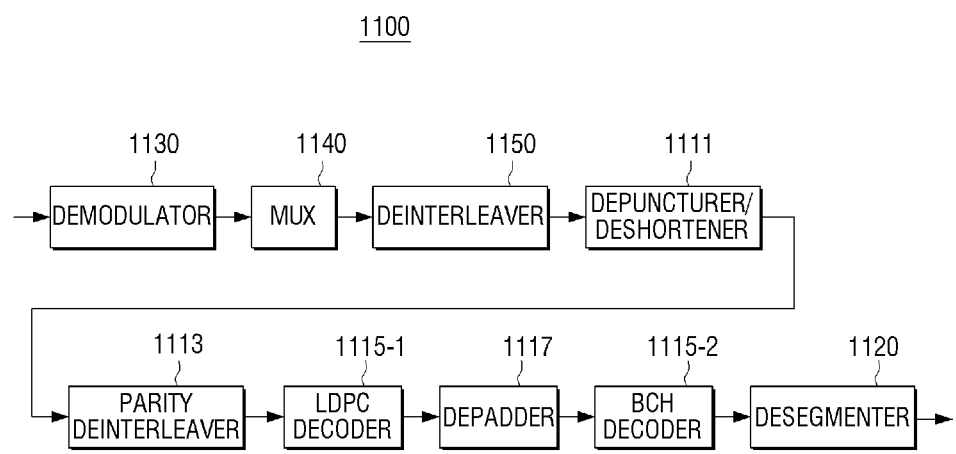
FIG. 13 is a block diagram illustrating a detailed configuration of a receiver, according to another exemplary embodiment.

However, in the case where the transmitter 200 uses the constituent elements as illustrated in FIG. 10, the receiver 1100 may process the L1 post signaling using the constituent elements as illustrated in FIG. 13. In this case, although the arrangement of the constituent elements differs from that as described above with reference to FIG. 12, the constituent elements perform the same operation. Accordingly, explanation will be made with regard to different aspects compared to FIG. 12.

The LDPC decoder 1115-1 may output bits generated as a result of decoding to the depadder 1117. In the case, the bits that are input to the depadder 1117 may include a segmented L1 post signaling, zero bits padded to the segmented L1 post signaling, and BCH parity bits.

The depadder 1117 may remove the zero bits from the bits output from the LDPC decoder 1115-1 to output resultant bits to the BCH decoder 1115-2.

Accordingly, since the bits input to the BCH decoder 1115-2 includes the segmented L1 post signaling and the BCH parity bits, the BCH decoder 1115-2 may correct errors using the BCH parity bits and may output the segmented L1 post signaling.

Information that is required to operate the respective constituent elements may be provided from the transmitter 200 or may be pre-stored in the receiver 1100. Here, the information that is required to operate the respective constituent elements may be, for example, a multiplexing type performed by the MUX 1140, a deinterleaving type performed by the deinterleaver 1150, the positions and number of LLR values that are added by the decoder 1110, a parity interleaving type, information used during decoding (e.g., a code rate, the length of an LDPC codeword, information on a parity check matrix, or information on the length of a BCH codeword), or information on the order in which the desegmenter 1120 desegments the segmented L1 post signaling.

In the above-described example, it is described that the L1 post signaling is segmented and transmitted to the receiver 1100, but is not limited thereto. If the L1 post signaling is formed of bits the number of which is equal to or smaller than a predetermined number, the L1 post signaling may not be segmented, but may be transmitted to the receiver 1100. Here, the predetermined number may be $K_{th}$ as described above. In this case, since bit strings input to the desegmenter 1120 can be configured by the L1 post signaling, the desegmenter 1120 may output the L1 post signaling without any separate desegmentation.

Figure 14:
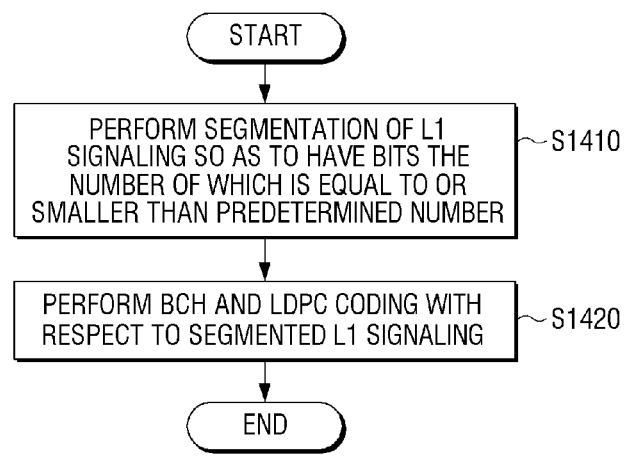
FIG. 14 is a flowchart illustrating a signal processing method of a transmitter, according to an exemplary embodiment.

FIG. 14 is a flowchart illustrating a signal processing method of a transmitter, according to an exemplary embodiment.

First, L1 signaling is segmented such that a segmented L1 signaling has bits the number of which is equal to or smaller than a predetermined number (S1410).

Thereafter, BCH and LDPC encoding is performed with respect to the segmented L1 signaling (S1420).

Here, the predetermined number may be smaller than the length of an information word of the BCH encoding or the length of the information word of the LDPC encoding. The predetermined number may be calculated on the basis of a required transmission code rate, the number of parity bits generated by the BCH encoding, and the number of parity bits generated by the LDPC encoding. Specifically, the predetermined number may be calculated on the basis of Equation 5. The detailed contents related to this have been described.

Figure 15:
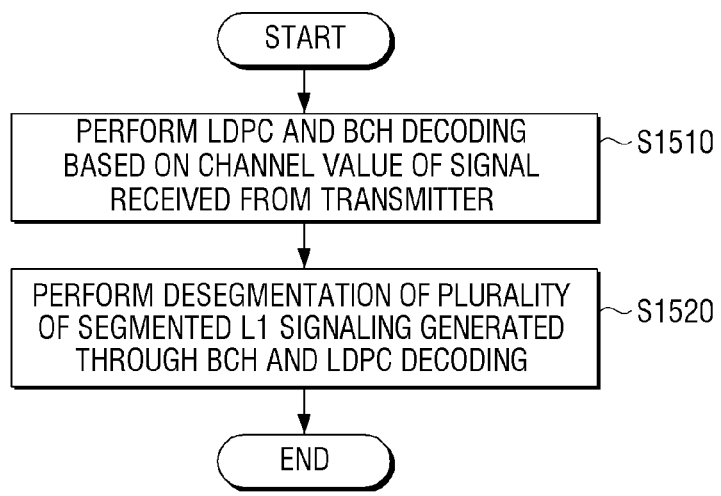
FIG. 15 is a flowchart illustrating a signal processing method of a receiver, according to an exemplary embodiment.

FIG. 15 is a flowchart illustrating a signal processing method of a receiver, according to an exemplary embodiment.

First, LDPC and BCH decoding is performed on the basis of a channel value of a signal that is received from a transmitter 200 (S1510).

Thereafter, a plurality of L1 signalings generated by the LDPC and BCH decoding are desegmented (S1520).

Here, each of the L1 signaling is segmented at a transmitter such that bits of a segmented L1 signaling is equal to or smaller than a predetermined number, and BCH and LDPC encoded. In this case, the predetermined number may be smaller than the length of an information word of the BCH encoding or the length of an information word of the LDPC encoding, and may be calculated on the basis of a required transmission code rate, the number of parity bits generated by the BCH encoding, and the number of parity bits generated by the LDPC encoding. Specifically, the predetermined number may be calculated on the basis of Equation 5. The detailed contents related to this have been described.

A non-transitory computer readable medium may be provided, which stores a program that sequentially performs the signal processing method according to the above embodiments.

The non-transitory computer readable medium is not a medium that stores data for a short period, such as a register, a cache, or a memory, but means a medium which semipermanently stores data and is readable by a device. Specifically, various applications and programs as described above may be stored and provided in the non-transitory computer readable medium, such as, a compact disk (CD), a digital versatile disk (DVD), a hard disc, a Blu-ray disc, a universal serial bus (USB), a memory card, and a read-only memory (ROM).

At least one of the components, elements or units represented by a block as illustrated in FIGS. 2, 4A, 4B and 9-13 may be embodied as various numbers of hardware, software and/or firmware structures that execute respective functions described above, according to an exemplary embodiment. For example, at least one of these components, elements or units may use a direct circuit structure, such as a memory, processing, logic, a look-up table, etc. that may execute the respective functions through controls of one or more microprocessors or other control apparatuses. Also, at least one of these components, elements or units may be specifically embodied by a module, a program, or a part of code, which contains one or more executable instructions for performing specified logic functions. Also, at least one of these components, elements or units may further include a processor such as a central processing unit (CPU) that performs the respective functions, a microprocessor, or the like. Further, although a bus is not illustrated in the above block diagrams, communication between the components, elements or units may be performed through the bus.

While the inventive concept has been shown and described with reference to exemplary embodiments thereof, it will be understood by those skilled in the art that various changes in form and detail may be made therein without departing from the spirit and scope of the inventive concept, as defined by the appended claims.

What is claimed is:

1. A transmitter comprising:
a segmenter configured to segment input bits based on a predetermined value;
a Bose, Chaudhuri, Hocquenghem (BCH) encoder configured to encode the segmented input bits;
a Low Density Parity Check (LDPC) encoder configured to encode information bits comprising the BCH encoded bits and zero bits to generate parity bits,
a puncturer configured to puncture at least part of the parity bits; and
a zero bits remover configured to remove the zero bits,
wherein the predetermined value is determined based on an LDPC code of the LDPC encoder and a ratio of a number of parity bits to be punctured and a number of zero bits to be removed.

2. The transmitter as claimed in claim 1, wherein the predetermined number is smaller than at least one of a length of an information word of the BCH encoding and a length of an information word of the LDPC encoding.

3. The transmitter as claimed in claim 1, wherein the predetermined number is calculated based on a predetermined transmission code rate, a number of parity bits generated by the BCH encoding, and a number of parity bits generated by the LDPC encoding.

4. The transmitter as claimed in claim 3, wherein the predetermined number is calculated based on a following equation:

$$K_{th} = \left\lfloor \frac{R_t}{1-R_t} \cdot N_{parity} \right\rfloor - N_{bch\_parity},$$

where $K_{th}$ is the predetermined number, $R_t$ is the predetermined transmission code rate, $N_{parity}$ is the number of parity bits generated by the LDPC encoding, and $N_{bch\_parity}$ is the number of parity bits generated by the BCH encoding.

5. The transmitter as claimed in claim 1, wherein the BCH encoder is configured to add at least one padding bit to the segmented input bits so that all of the at least one padding bit has a same value.

6. A signal processing method of a transmitter comprising:
segmenting input bits based on a predetermined value;
Bose, Chaudhuri, Hocquenghem (BCH) encoding the segmented input bits;
Low Density Parity Check (LDPC) encoding information bits comprising the BCH encoded bits and zero bits to generate parity bits,
puncturing at least part of the parity bits; and
removing the zero bits,
wherein the predetermined value is determined based on an LDPC code of the LDPC encoding and a ratio of a number of parity bits to be punctured and a number of zero bits to be removed.

7. The signal processing method as claimed in claim 6, wherein the predetermined number is smaller than at least one of a length of an information word of the BCH encoding and a length of an information word of the LDPC encoding.

8. The signal processing method as claimed in claim 6, wherein the predetermined number is calculated based on a predetermined transmission code rate, a number of parity bits generated by the BCH encoding, and a number of parity bits generated by the LDPC encoding.

9. The signal processing method as claimed in claim 8, wherein the predetermined number is calculated based on a following equation:

$$K_{th} = \left\lfloor \frac{R_t}{1-R_t} \cdot N_{parity} \right\rfloor - N_{bch\_parity},$$

where $K_{th}$ is the predetermined number, $R_t$ is the predetermined transmission code rate, $N_{parity}$ is the number of parity bits generated by the LDPC encoding, and $N_{bch\_parity}$ is the number of parity bits generated by the BCH encoding.

10. The signal processing method as claimed in claim 6, further comprising adding at least one padding bit to the segmented input bits so that all of the at least one padding bit has a same value.

11. A receiver comprising:
a decoder configured to perform Low Density Parity Check (LDPC) decoding and Bose, Chaudhuri, Hocquenghem (BCH) decoding, or the LDPC decoding without the BCH decoding, to output a plurality of segmented bits; and
a desegmenter configured to perform desegmentation of the plurality of segmented bits output from the LDPC decoding and the BCH decoding or the LDPC decoding without the BCH decoding,
wherein the segmented bits are generated at a transmitter by segmenting input bits input to the transmitter based on a predetermined value which is determined based on:
an LDPC code used at the transmitter for LDPC encoding information bits comprising BCH encoded bits, which are generated by BCH encoding the segmented input bits, and zero bits, and a ratio of a number of parity bits, which are generated by the LDPC encoding the information bits, to be punctured and a number of zero bits to be removed at the transmitter.

12. The receiver as claimed in claim 11, wherein the predetermined number is smaller than at least one of a length of an information word of the BCH encoding and a length of an information word of the LDPC encoding.

13. The receiver as claimed in claim 11, wherein the predetermined number is calculated based on t a predetermined transmission code rate, a number of parity bits generated by BCH encoding performed by the transmitter, and a number of parity bits generated by LDPC encoding performed by the transmitter.

14. The receiver as claimed in claim 13, wherein the predetermined number is calculated based on a following equation:

$$K_{th} = \left\lfloor \frac{R_t}{1-R_t} \cdot N_{parity} \right\rfloor - N_{bch\_parity},$$

where $K_{th}$ is the predetermined number, $R_t$ is the predetermined transmission code rate, $N_{parity}$ is the number of parity bits generated by the LDPC encoding, and $N_{bch\_parity}$ is the number of parity bits generated by the BCH encoding.

15. The receiver as claimed in claim 11, wherein the BCH decoder is configured to remove at least one padding bit which is added to the segmented input bits so that all of the at least one padding bit has a same value.

16. A signal processing method of a receiver comprising:
performing Low Density Parity Check (LDPC) decoding and Bose, Chaudhuri, Hocquenghem (BCH) decoding, or the LDPC decoding without the BCH decoding, to output a plurality of segmented bits; and
performing desegmentation of the plurality of segmented bits output from the LDPC decoding and the BCH decoding or the LDPC decoding without the BCH decoding,
wherein the segmented bits are generated at a transmitter by segmenting input bits input to the transmitter based on a predetermined value which is determined based on:
an LDPC code used at the transmitter for LDPC encoding information bits comprising BCH encoded bits, which are generated by BCH encoding the segmented input bits, and zero bits, and
a ratio of a number of parity bits, which are generated by the LDPC encoding the information bits, to be punctured and a number of zero bits to be removed at the transmitter.

17. The signal processing method as claimed in claim 16, wherein the predetermined number is smaller than at least one of a length of an information word of the BCH encoding and a length of an information word of the LDPC encoding.

18. The signal processing method as claimed in claim 16, wherein the predetermined number is calculated based on a predetermined transmission code rate, a number of parity bits generated by BCH encoding performed by the transmitter, and a number of parity bits generated by LDPC encoding performed by the transmitter.

19. The signal processing method as claimed in claim 18, wherein the predetermined number is calculated based on a following equation:

$$K_{th} = \left\lfloor \frac{R_t}{1-R_t} \cdot N_{parity} \right\rfloor - N_{bch\_parity},$$

where $K_{th}$ is the predetermined number, $R_t$ is the predetermined transmission code rate, $N_{parity}$ is the number of parity bits generated by the LDPC encoding, and $N_{bch\_parity}$ is the number of parity bits generated by the BCH encoding.

20. The signal processing method as claimed in claim 16, further comprising removing at least one padding bit the segmented input bits so that all of the at least one padding bit has a same value.

* * * * *